United States Patent
Wang et al.

(10) Patent No.: US 10,878,985 B2
(45) Date of Patent: Dec. 29, 2020

(54) SPIN ORBIT TORQUE GENERATING MATERIALS

(71) Applicant: Regents of the University of Minnesota, Minneapolis, MN (US)

(72) Inventors: Jian-Ping Wang, Shoreview, MN (US); Mahendra DC, Saint Paul, MN (US); Mahdi Jamali, Folsom, CA (US); Andre Mkhoyan, Minneapolis, MN (US); Danielle Hickey, State College, PA (US)

(73) Assignee: Regents of the University of Minnesota, Minneapolis, MN (US)

( * ) Notice: Subject to any disclaimer, the term of this patent is extended or adjusted under 35 U.S.C. 154(b) by 66 days.

(21) Appl. No.: 15/836,421

(22) Filed: Dec. 8, 2017

(65) Prior Publication Data
US 2018/0166197 A1  Jun. 14, 2018

Related U.S. Application Data

(60) Provisional application No. 62/432,465, filed on Dec. 9, 2016.

(51) Int. Cl.
*G11C 11/00* (2006.01)
*H01F 10/32* (2006.01)
(Continued)

(52) U.S. Cl.
CPC .......... *H01F 10/329* (2013.01); *G11C 11/161* (2013.01); *G11C 11/1675* (2013.01);
(Continued)

(58) Field of Classification Search
CPC ...... H01F 10/329; H01F 10/123; H01F 10/30; G11C 11/161; G11C 11/1675; G11C 11/18; H01L 43/04; H01L 43/06; H01L 43/10
See application file for complete search history.

(56) References Cited

U.S. PATENT DOCUMENTS

2005/0146955 A1    7/2005   Kajiyama
2007/0176251 A1    8/2007   Oh et al.
(Continued)

FOREIGN PATENT DOCUMENTS

JP      07246777 A   *   9/1995

OTHER PUBLICATIONS

Yu et al., "Switching of Perpendicular Magnetization by Spin-Orbit Torques in the Absence of External Magnetic Fields," Nature Nanotechnology, vol. 9, Jul. 2014, pp. 548-554.
(Continued)

*Primary Examiner* — Toan K Le
(74) *Attorney, Agent, or Firm* — Shumaker & Sieffert, P.A.

(57) ABSTRACT

A material may include at least one of $Bi_xSe_{(1-x)}$, $Bi_xTe_{(1-x)}$, or $Sb_xTe_{(1-x)}$, where x is greater than 0 and less than 1. In some examples, the material exhibits a Spin Hall Angle of greater than 3.5 at room temperature. The disclosure also describes examples of devices that include a spin-orbit torque generating layer, in which the spin-orbit torque generating layer includes at least one of $Bi_xSe_{(1-x)}$, $Bi_xTe_{(1-x)}$, or $Sb_xTe_{(1-x)}$, where x is greater than 0 and less than 1. In some examples, the spin-orbit torque generating layer exhibits a Spin Hall Angle of greater than 3.5 at room temperature.

34 Claims, 20 Drawing Sheets

(51) Int. Cl.
| | |
|---|---|
| G11C 11/16 | (2006.01) |
| H01F 10/12 | (2006.01) |
| H01L 43/04 | (2006.01) |
| G11C 11/18 | (2006.01) |
| H01L 43/10 | (2006.01) |
| H01L 43/08 | (2006.01) |
| H01L 43/06 | (2006.01) |
| H01F 10/30 | (2006.01) |

(52) U.S. Cl.
CPC ............ *G11C 11/18* (2013.01); *H01F 10/123* (2013.01); *H01F 10/30* (2013.01); *H01L 43/04* (2013.01); *H01L 43/06* (2013.01); *H01L 43/08* (2013.01); *H01L 43/10* (2013.01)

(56) References Cited

U.S. PATENT DOCUMENTS

| | | |
|---|---|---|
| 2010/0072524 A1 | 3/2010 | Huai et al. |
| 2011/0007421 A1 | 1/2011 | Hara et al. |
| 2014/0264513 A1* | 9/2014 | De Brosse ............ H01L 43/065 257/295 |
| 2018/0366172 A1* | 12/2018 | Wang ...................... H01L 43/08 |
| 2019/0043547 A1* | 2/2019 | DeBrosse ............. H01L 43/065 |

OTHER PUBLICATIONS

You et al., "Switching of Perpendicularly Polarized Nanomagnets with Spin Orbit Torque without an External Magnetic Field by Engineering a Tilted Anisotropy," Proceedings of the National Academy of Sciences of the United States of America (PNAS), vol. 112, No. 33, Aug. 18, 2015, pp. 10310-10315.
Fukami et al., "Magnetization Switching by Spin-Orbit Torque in an Antiferromagnet-Ferromagnet Bilayer System," Nature Materials, vol. 15, May 2016, pp. 535-542.
Oh et al., "Field-Free Switching of Perpendicular Magnetization Through Spin-Orbit Torque in Antiferromagnet/Ferromagnet/Oxide Structures," Nature Nanotechnology, vol. 11, Oct. 2016, pp. 878-885.
Lau et al., "Spin-Orbit Torque Switching Without an External Field Using Interlayer Exchange Coupling," Nature Nanotechnology, vol. 11, Sep. 2016, pp. 758-762.
Van Den Brink et al., "Field-Free Magnetization Reversal by Spin-Hall Effect and Exchange Bias," Nature Communications, vol. 7, No. 10584, Mar. 4, 2016, 20 pp.
Zhao et al., "External Field Free Spin Hall Switching of Perpendicular Magnetic Nanopillar with a Dipole-Coupled Composite Structure," arXiv:1603,09624, Feb. 8, 2016, 30 pp.
Kong et al., "Field-Free Spin Hall Effect Driven Magnetization Switching in Pd/Co/IrMn Exchange Coupling System," Applied Physics Letter, vol. 109, No. 132402, Sep. 26, 2016, 5 pp.
DC et al., "Room-Temperature Perpendicular Magnetization Switching Through Giant Spin-Orbit Torque From Sputtered BixSe(l-x) Topological insulator Material," University of Minnesota, Mar. 10, 2017, 14 pp.
Brataas et al., "Spin-Orbit Torques in Action," Nature Nanotechnology, vol. 9, Feb. 2014, pp. 86-88.
Cubukcli et al., "Spin-Orbit Torque Magnetization Switching of a Three-Terminal Perpendicular Magnetic Tunnel Junction," Applied Physics Letters, vol. 104, No. 042406, Jan. 30, 2014, 5 pp.
Hals et al., "Phenomenology of Current-Induced Spin-Orbit Torques," Physical Review B, vol. 88, No. 085423, Aug. 20, 2013, 5 pp.
Manchon et al., "Theory of Spin Torque Due to Spin-Orbit Coupling," Physical Review B, vol. 79, No. 94422, Mar. 23, 2009, 9 pp.
Wang et al., "Spin-Orbit-Coupled Transport and Spin Torque in a Ferromagnetic Heterostructure," Physical Review B, vol. 89, No. 054405, Feb. 7, 2014, 11 pp.
Lilt et al., "Spin-Torque Switching with the Giant Spin Hall Effect of Tantalum," Science, vol. 336, May 4, 2012, pp. 555-558.

Liu et al., "Current-Induced Switching of Perpendicularly Magnetized Magnetic Layers Using Spin Torque from the Spin Hall Effect," Physical Review Letters, vol. 109, No. 096602, Aug. 31, 2012, 5 pp.
Pai et al., "Spin Transfer Torque Devices Utilizing the Giant Spin Hall Effect of Tungsten," Applied Physics Letters, vol. 101, Aug. 2012, 18 pp.
Zhao et al., "Spin Hall Switching of the Magnetization in Ta/TbFeCo Structures with Bulk Perpendicular Anistropy," Applied Physics Letters, vol. 106, No. 132404, Mar. 30, 2015, 4 pp.
Miron et al., "Current-driven Spin Torque Induced by the Rashba Effect in a Ferromagnetic Metal Layer," Nature Materials, vol. 9, Mar. 2010, pp. 11 pp.
Jamali et al., "Giant Spin Pumping and Inverse Spin Hall Effect in the Presence of Surface and Bulk Spin-Orbit Coupling of Topological Insulator Bi2Se3," Nano Letters, ACS Publications, Sep. 14, 2015, pp. 7126-7132.
Mfllnik et al., "Spin Transfer Torque Generated by a Topological Insulator," Nature, vol. 511, Jul. 24, 2014, pp. 449-451.
Fan et al., "Magnetization Switching Through Giant Spin-Orbit Torque in a Magnetically Doped Topological Insulator Heterostructure," Nature Materials, Apr. 28, 2014, 6 pp.
Sinova et al., "Spin Hall Effects," Reviews of Modern Physics, vol. 87, Oct.-Dec. 2015, pp. 1213-1260.
Hoffmann, "Spin Hall Effects in Metals," IEEE Transactions on Magnetics, vol. 49, No. 10, Oct. 2013, pp. 5172-5193.
Brataas et al., "Current-Induced Torques in Magnetic Materials," Nature Materials, vol. 11, May 2012, pp. 372-381.
Slonczewski, "Current-Driven Excitation of Magnetic Multilayers," Journal of Magnetism and Magnetic Materials, vol. 159, Dec. 19, 1996, pp. L1-L7.
Chappert et al., "The Emergence of Spin Electronics in Data Storage," Nature Materials, vol. 6, Dec. 2007, 28 pp.
Kryder et al., "After Hard Drives—What Comes Next," IEEE Transactions on Magnetics, vol. 45, No. 10, Oct. 2009, pp. 3406-3413.
Kim et al., "Layer Thickness Dependence of the Current-Induced Effective Field Vector in Ta/CoFeB/MgO," Nature Materials, vol. 12, Mar. 2013, 6 pp.
Miron et al., "Perpendicular Switching of a Single Ferromagnetic Layer Induced by In-Plane Current Injection," Nature, vol. 476, Aug. 11, 2011, pp. 189-194.
Fan et al., "Observation of the Nonlocal Spin-Orbital Effective Field," Nature Communications, Apr. 30, 2012, 7 pp.
Hao et al., "Giant Spin Hall Effect and Switching Induced by Spin-Transfer Torque in a W/Co40Fe40B20/MgO Structure with Perpendicular Magnetic Anisotropy," Physical Review Applied, vol. 3, No. 034009, Mar. 26, 2015, 6 pp.
Jamali et al., "Planar Hall Effect Based Characterization of Spin Orbital Torques in Ta/CoFeb/MgO Structures," Journal of Applied Physics, vol. 119, No. 133902, Apr. 1, 2016, pp. 5 pp.
Kawaguchi et al., "Current-Induced Effective Fields Detected by Magnetotrasport Measurements," Applied Physics Express, vol. 6, No. 113002, Oct. 18, 2013, 4 pp.
Kawaguchi et al., "Layer Thickness Dependence of Current Induced Effective Fields in Ferromagnetic Multilayers," Journal of Applied Physics, vol. 117, No. 17C730, Mar. 25, 2015, 3 pp.
Garello et al., "Symmetry and Magnitude of Spin-Orbit Torques in Ferromagnetic Heterostructures," Nature Nanotechnology, vol. 8, Aug. 2013, pp. 587-593.
Xu et al., "Scaling Law of Anamalous Hall Effect in Fe/Cu Bilyers," The European Physical Journal B, vol. 65, Jul. 3, 2008, pp. 233-237.
Li et al., "Large-Area Synthesis of High-Quality and Uniform Graphene Films on Copper Foils," Science, vol. 324, Jun. 5, 2009, pp. 1312-1314.
Ni et al., "Magnetotransport Study of (Sb1-xBix)2 Te3 Thin Films on Mica Substrate for Ideal Topological Insulator," ALP Advances, vol. 6, No. 055812, Feb. 29, 2016, 6 pp.
Emori et al., "Current-Driven Dynamics of Chiral Ferromagnetic Domain Walls," Nature Materials, Jun. 16, 2013, 6 pages.
Bhowmik et al., "Deterministic Domain Wall Motion Orthogonal to Current Flow Due to Spin Orbit Torque," Scientific Reports, vol. 5, No. 11823, Jul. 3, 2015, 10 pp.

(56) References Cited

OTHER PUBLICATIONS

Khvalkovsky et al., "Matching Domain-Wall Configuration and Spin-Orbit Torques for Efficient Domain-Wall Motion," Physical Review B, vol. 87, No. 020402, Jan. 2013, 5 pp.
Berger, "Motion of a Magnetic Domain Wall Traversed by Fast-Rising Current Pulses," Journal of Applied Physics, vol. 71, No. 6, Mar. 15, 1992, pp. 2721-2726.
Yamaguchi et al.,"Real-Space Observation of Current-Driven Domain Wall Motion in Submicron Magnetic Wires," Physical Review Letters, vol. 92, No. 7, Feb. 20, 2004, 4 pp.
Liu et al., "Spin-Torque Ferromagnetic Resonance Induced by the Spin Hall Effect," Physical Review Letters, vol. 106, Jan. 21, 2011, 4 pp.
Parkin et al., "Magnetic Domain-Wall Racetrack Memory," Science Magazine, vol. 320, Apr. 11, 2008, pp. 190-194.
Miron et al., "Fast Current-Induced Domain-Wall Motion Controlled by the Rashba Effect," Nature Materials, vol. 10, Jun. 2011, pp. 419-423.
Wolf et al., "Spintronics: A Spin-Based Electronics Vision for the Future," Science Magazine, vol. 294, Nov. 16, 2001, pp. 1488-1495.
Zutic et al., "Spintronics: Fundamentals and Applications," Reviews of Modern Physics, vol. 76, No. 2, Apr. 2004, pp. 323-410.
Ralph et al., "Spin Transfer Torques," Journal of Magnetism and Magnetic Materials, vol. 320, Dec. 28, 2007, pp. 1190-1216.
Zhao et al., "Low Writing Energy and Sub Nanosecond Spin Torque Transfer Switching of In-Plane Magnetic Tunnel Junction for Spin Torque Transfer Random Access Memory," Journal of Applied Physics, vol. 109, Mar. 2011, 3 pp.
Diao, "Spin-Transfer Torque Switching in Magnetic Tunnel Junctions and Spin-Transfer Torque Random Access Memory," Journal of Physics: Condensed Matter, vol. 19, No. 16, Apr. 25, 2007, 13 pp.
Lyle et al., "Direct Communication Between Magnetic Tunnel for Non-Volatile Logic Fan-Out Architecture," vol. 97, Oct. 14, 2010, 3 pp.
Kawahara et al., "Spin-Transfer Torque RAM Technology: Review and Prospect," Microelectronics Reliability, vol. 52, Nov. 1, 2011, pp. 613-627.
Manchon et al., "Theory of Nonequilibrium intrinsic Spin Torque in a Single Nanomagnet," Physical Review B, vol. 78, Dec. 10, 2008, 4 pp.
Meng et al., "Spin Transfer in Nanomagnetic Devices with Perpendicular Anisotropy," Applied Physics Letters, vol. 88, Apr. 26, 2006, 3 pp.
Gareilo et al., "Ultrafast Magnetization Switching by Spin-Orbit Torques," Applied Physics Letters, vol. 105, Nov. 24, 2014, 5 pp.
Ikeda et al., "A Perpendicular-Anisotropy CoFeB—MgO Magnetic Tunnel Junction," Nature Materials, vol. 9, Sep. 2010, pp. 721-724.
Fukami et al., "A Spin-Orbit Torque Switching Scheme with Collinear Magnetic Easy Axis and Current Configuration," Nature Nanotechnology, vol. 11, Jul. 2016, pp. 621-626.
He et al., "All-Optical Switching of Magnetoresistive Devices Using Telecom-Band Femtosecond Laser," Applied Physics Letters, vol. 107, Sep. 2015, 4 pp.
Mangin et al., "Engineered Materials for All-Optical Helicity-Dependent Magnetic Switching," Nature Materials, vol. 13, Mar. 2014, pp. 286-292.
Chen et al., "Perpendicular Exchange Bias Effect in Sputter-Deposited CoFe/IrMn Bilayers," Applied Physics Letters, vol. 104, Apr. 16, 2014, 5 pp.
Zhang et al., "Spin Hall Effects in Metallic Antiferromagnets," Physical Review Letters, vol. 113, Nov. 4, 2014, 6 pp.
Ou et al., "Strong Spin Hall Effect in the Antiferromagnetic PtMn," Physical Review B, vol. 93, Jun. 20, 2016, 6 pp.
Wang et al., "Determination of Intrinsic Spin Hall Angle in Pt," Applied Physics Letters, vol. 105, Oct. 17, 2014, 4 pp.
Nan et al., "Comparison of Spin-Orbit Torques and Spin Pumping Across NiFe/Pt and NiFe/Cu/Pt Interfaces," Physical Review B, vol. 91, Jun. 11, 2015, 9 pp.
Wu et al., "Spin-Orbit Torques in Perpendicularly Magnetized Ir22Mn78/Co20Fe60B20/MgO Multilayer," Applied Physics Letters, vol. 109, Nov. 28, 2016, 6 pp.
Yu et al., "Magnetization Switching Through Spin-Hall-Effect-Induced Chiral Domain Wall Propagation," Physical Review B, vol. 89, Mar. 25, 2014, 6 pp.
Safeer et al., "Spin-Orbit Torque Magnetization Switching Controlled by Geometry," Nature Nanotechnology, vol. 11, Feb. 2016, pp. 15 pp.
Chen et al., "Field-Free Spin-Orbit Torque Switching of Composite Perpendicular CoFeB/Gd/CoFeB Layers Utilized for Three-Terminal Magnetic Tunnel Junctions," Applied Physics Letters, vol. 111, Jul. 2017, 14 pp.
U.S. Appl. No. 15/730,405, filed Oct. 11, 2017, by Wang et al.
Chen et al., "Field-free spin-orbit torque switching of composite perpendicular CoFeB/Gd/CoFeB layers utilized for three-terminal magnetic tunnel junctions," Applied Physics Letters, published online Jul. 5, 2017, 6 pp.

\* cited by examiner

FIG. 6A
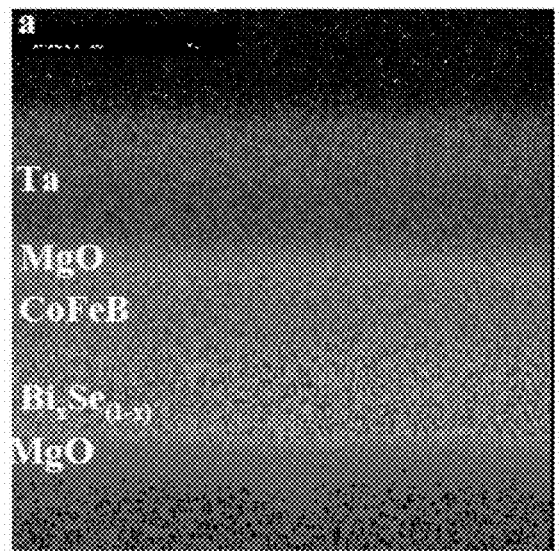
FIG. 6B
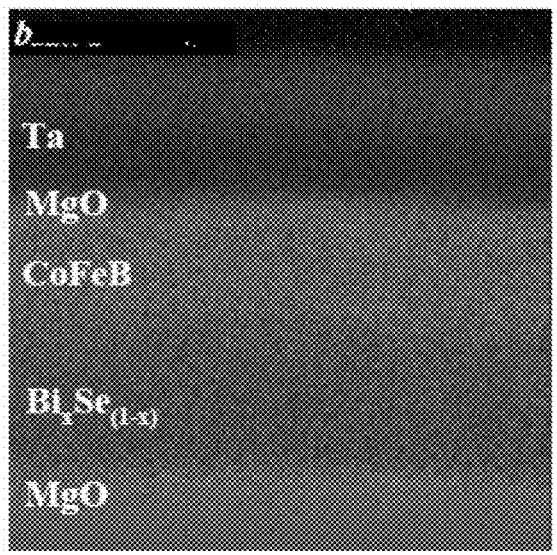
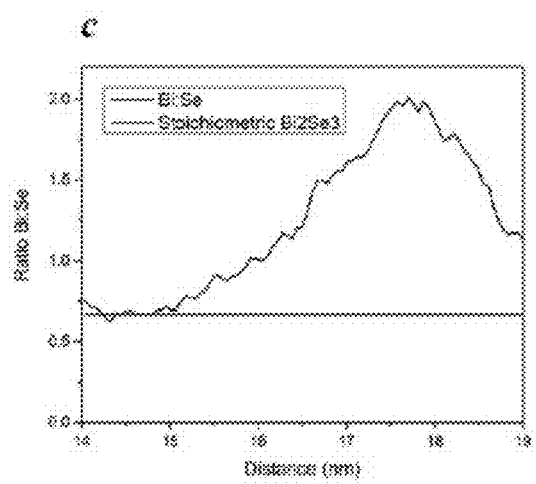
FIG. 6C
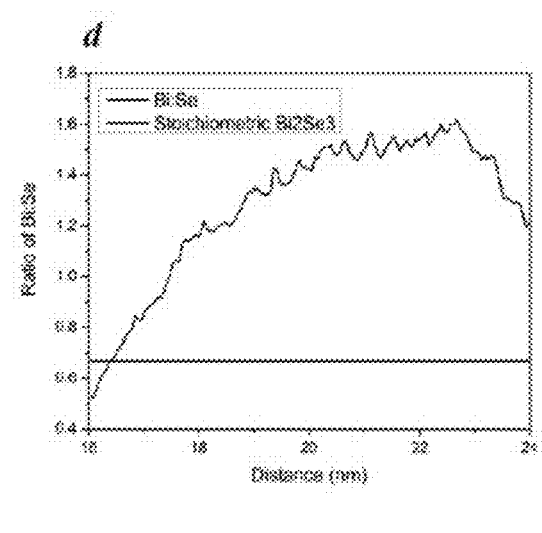
FIG. 6D

FIG. 9A FIG. 9B
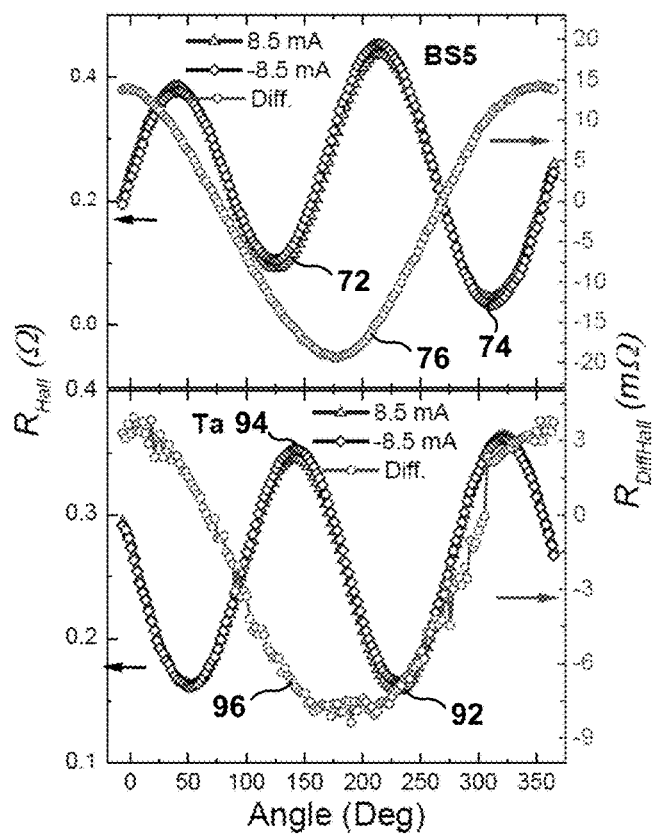
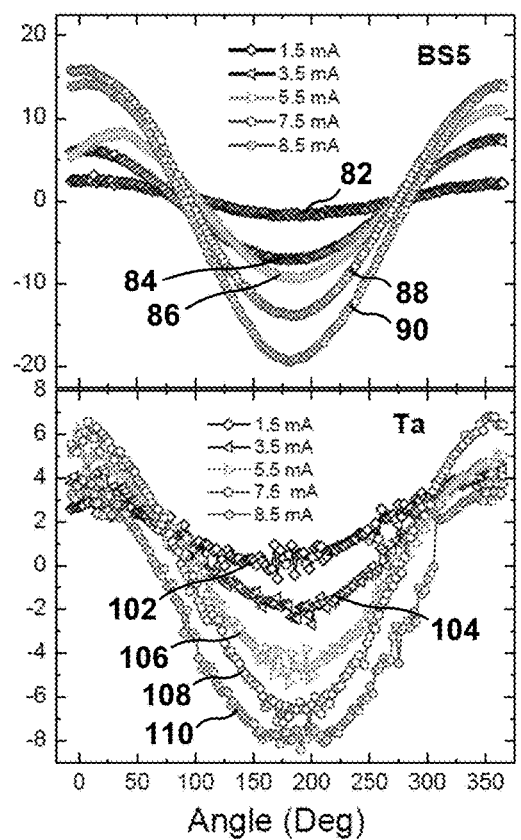
FIG. 9C FIG. 9D

FIG. 12E
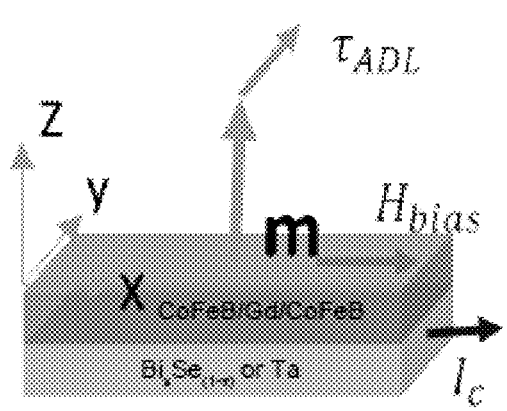
FIG. 12F
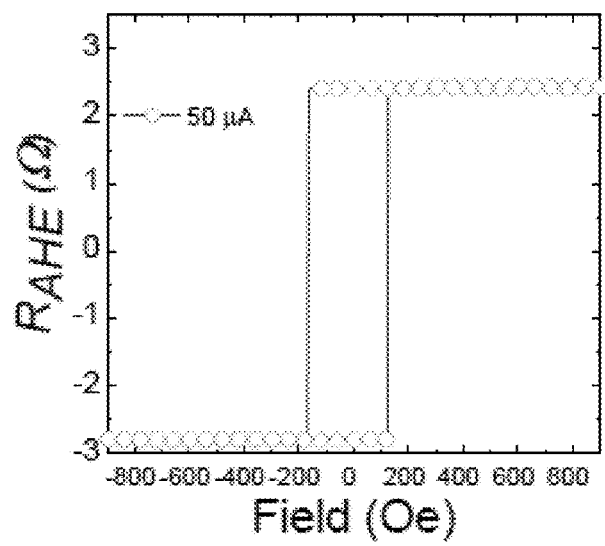
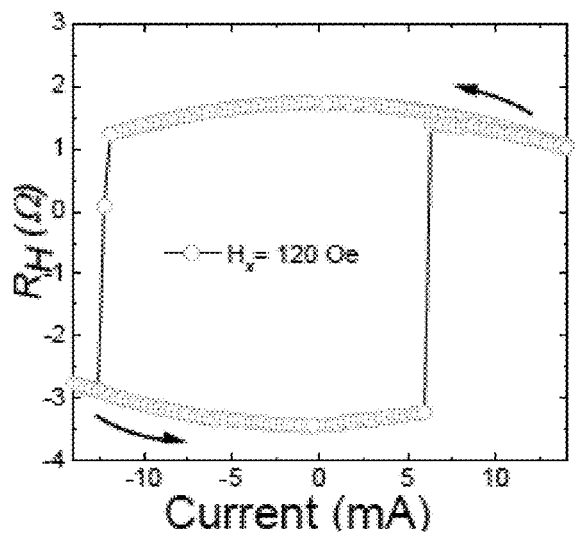
FIG. 12G
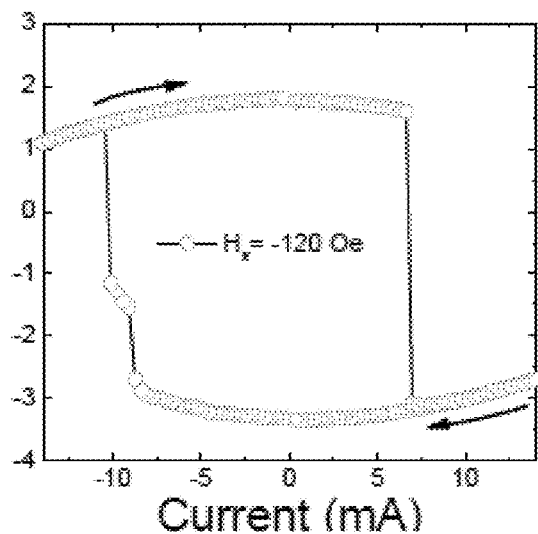
FIG. 12H

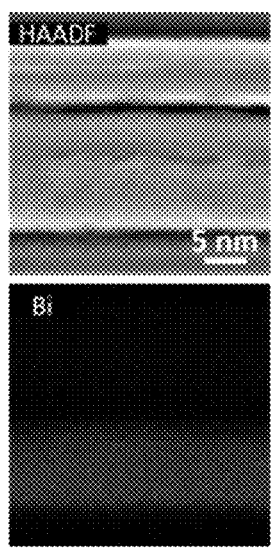
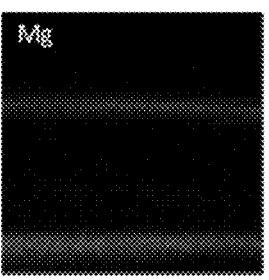
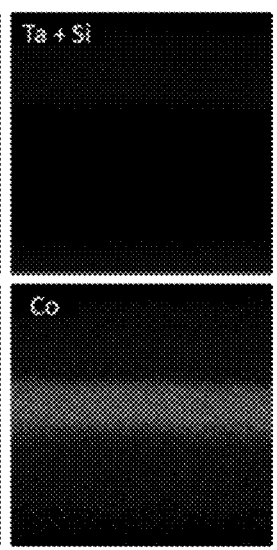
FIG. 13A  FIG. 13B  FIG. 13C  FIG. 13D
FIG. 13E  FIG. 13F  FIG. 13G  FIG. 13H FIG. 14A
FIG. 14B
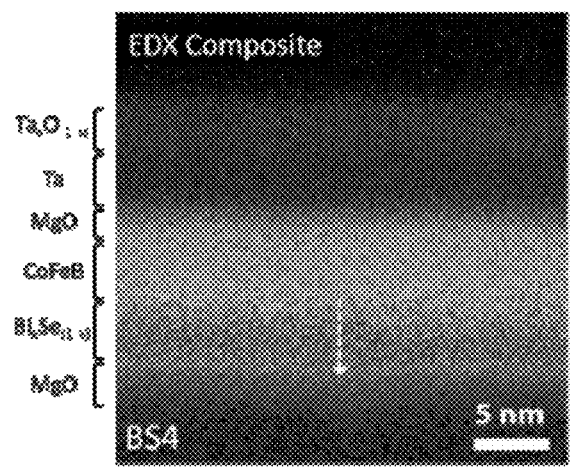
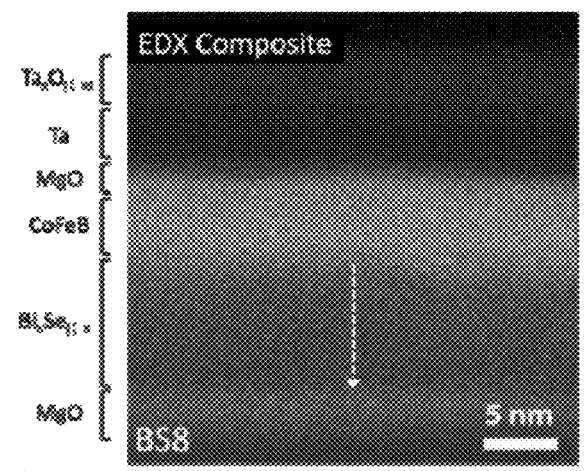
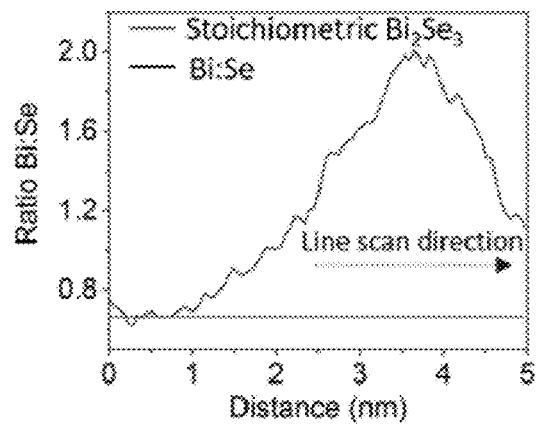
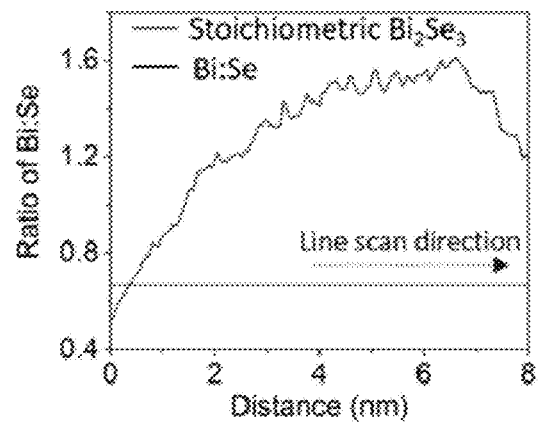
FIG. 14C
FIG. 14D

FIG. 16A
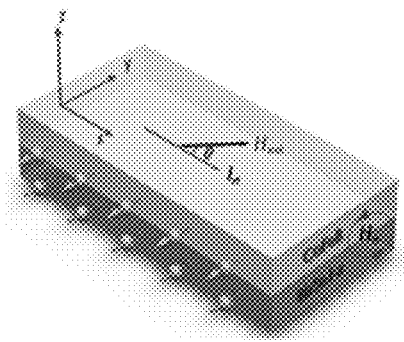
FIG. 16B
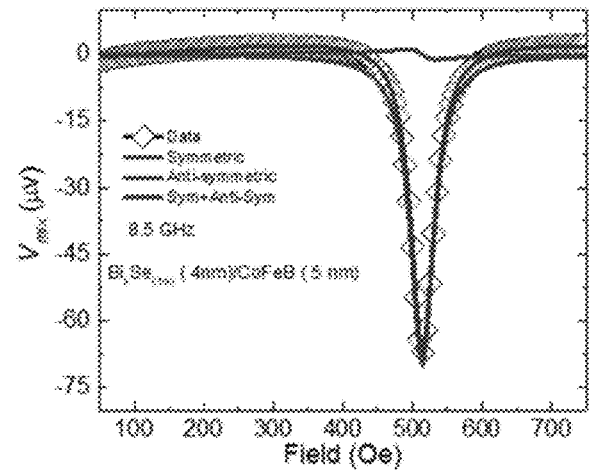
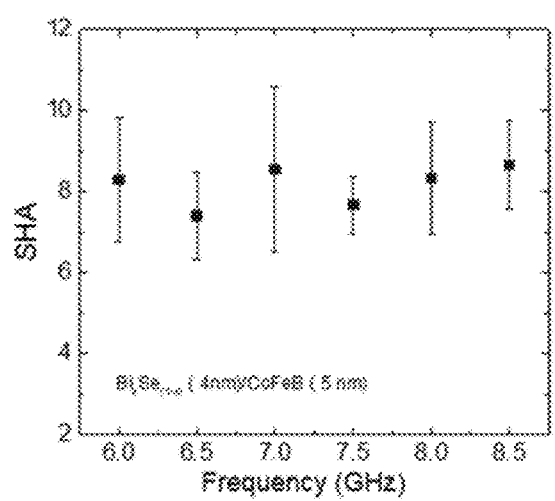
FIG. 16C
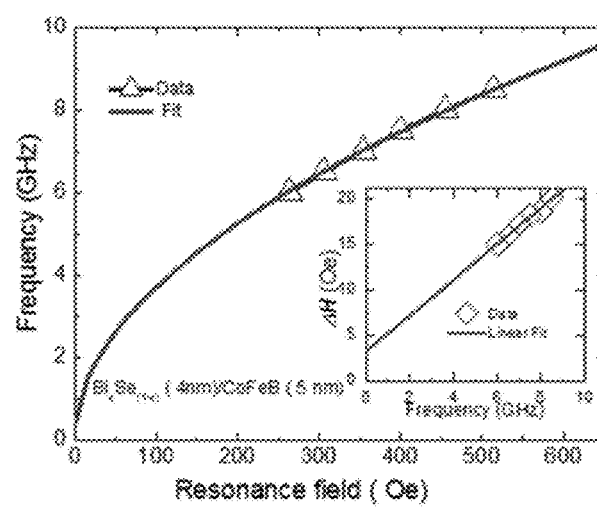
FIG. 16D

FIG. 17A
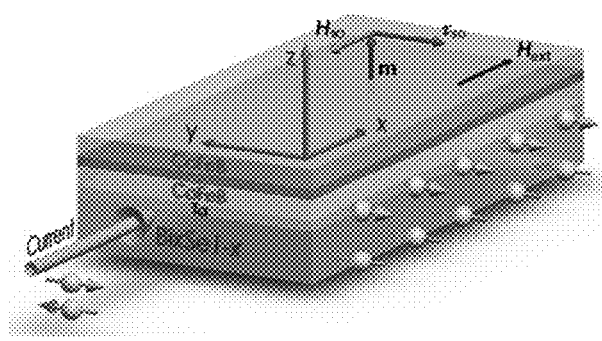
FIG. 17B
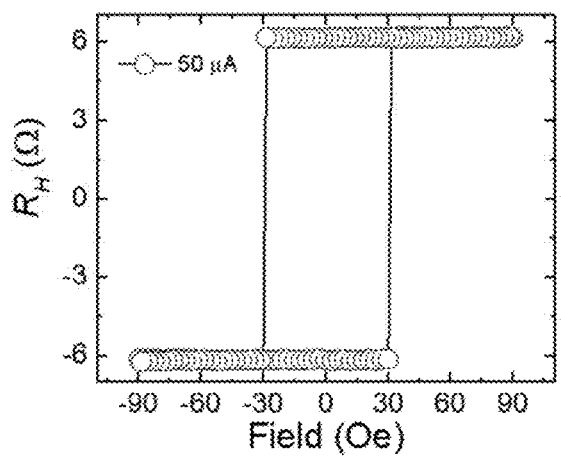
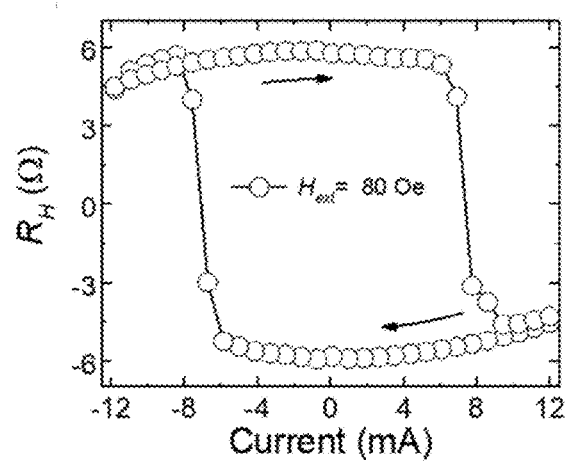
FIG. 17C
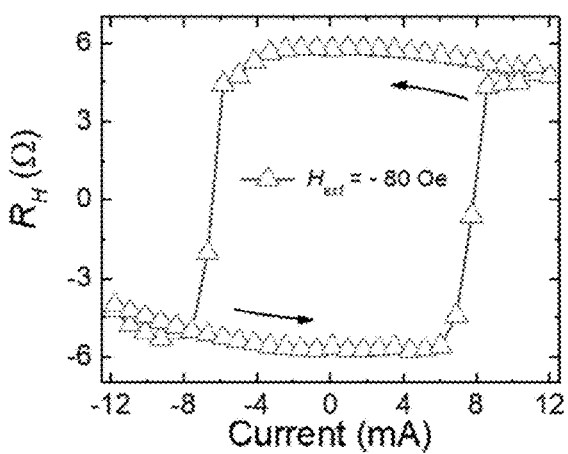
FIG. 17D

FIG. 18A
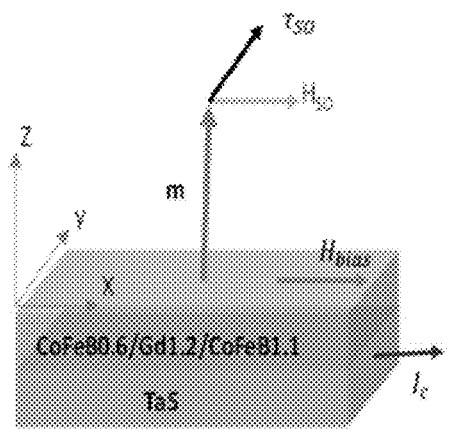
FIG. 18B
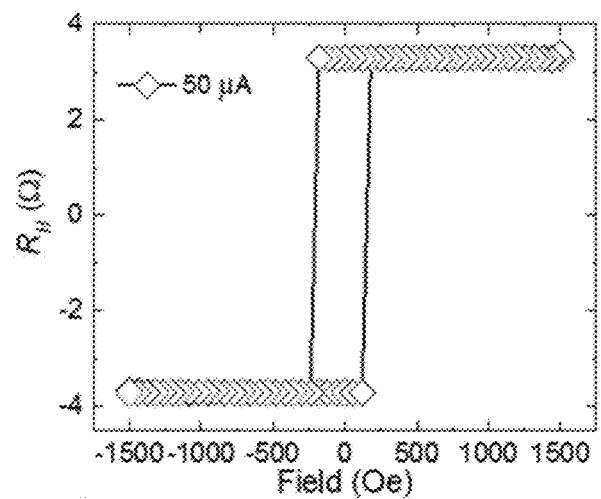
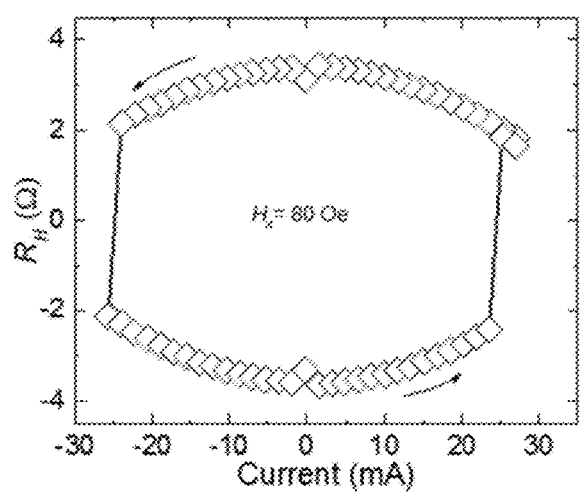
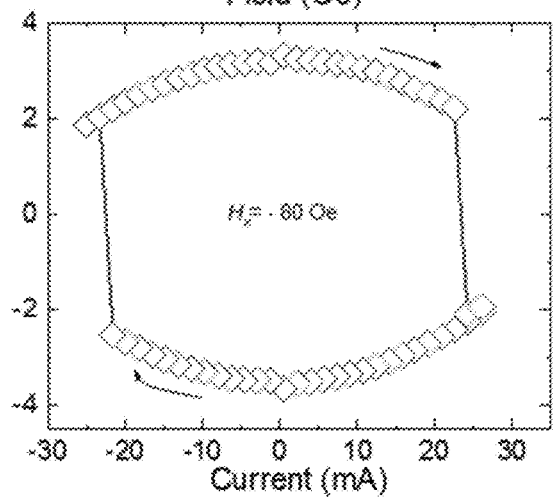
FIG. 18C
FIG. 18D

SPIN ORBIT TORQUE GENERATING MATERIALS

RELATED APPLICATIONS

This application claims the benefit of U.S. Provisional Patent Application No. 62/432,465, filed Dec. 9, 2016, the entire content of which is incorporated herein by reference.

GOVERNMENT INTEREST

This invention was made with government funds under Grant No. HR0011-13-3-0002 awarded by Department of Defense/Defense Advanced Research Projects Agency (DARPA). The government has certain rights in this invention.

TECHNICAL FIELD

This disclosure relates to articles including magnetic structures, and more particularly, magnetic structures for memory and logic devices.

BACKGROUND

The scaling of conventional semiconductor devices may be limited by factors including device reliability and increased power consumption. Improvement in the performance of memory and computational devices is continuously pursued. Spin-based or spintronic devices may be used as alternatives to or in conjunction with electronic devices. Spin-based effects may be used by devices such as spintronic devices that harness the intrinsic spin of electrons and their associated magnetic moments, in addition to electronic phenomena that arise from the fundamental electronic charges of electrons. Magnetic structures may be used in spintronic devices including memory and computational (e.g., logic) devices.

SUMMARY

In general, the disclosure describes examples of a material that includes at least one of $Bi_xSe_{(1-x)}$, $Bi_xTe_{(1-x)}$, or $Sb_xTe_{(1-x)}$, where x is greater than 0 and less than 1.

The disclosure also describes examples of a material that includes at least one of $Bi_xSe_{(1-x)}$, $Bi_xTe_{(1-x)}$, or $Sb_xTe_{(1-x)}$, in which x is greater than 0 and less than 1, and in which the material exhibits a Spin Hall Angle of greater than 3.5 at room temperature.

The disclosure also describes examples of devices that include a spin-orbit torque generating layer, in which the spin-orbit torque generating layer includes at least one of $Bi_xSe_{(1-x)}$, $Bi_xTe_{(1-x)}$, or $Sb_xTe_{(1-x)}$, where x is greater than 0 and less than 1.

The disclosure also describes examples of devices that include a spin-orbit torque generating layer, in which the spin-orbit torque generating layer includes at least one of $Bi_xSe_{(1-x)}$, $Bi_xTe_{(1-x)}$, or $Sb_xTe_{(1-x)}$, in which x is greater than 0 and less than 1, and in which the spin-orbit torque generating layer exhibits a Spin Hall Angle of greater than 3.5 at room temperature.

The details of one or more examples are set forth in the accompanying drawings and the description below. Other features, objects, and advantages of the disclosure will be apparent from the description and drawings, and from the claims.

BRIEF DESCRIPTION OF DRAWINGS

FIGS. 6A and 6B are EDX composite maps for samples BS5 and BS10, respective.

FIGS. 6C and 6D are EDX line scans for Bi—Se composition for BS5 and BS10 samples, respectively.

FIGS. 9A and 9C show angle-dependent Hall resistance for samples BS5 and Ta at ±8 mA bias current.

FIGS. 9B and 9D show the angle-dependent difference in Hall resistances at different bias currents for samples BS5 and Ta, respectively.

FIGS. 12A and 12F are plots illustrating measurement of out-of-plane magnetization by measuring $R_{AHE}$.

FIG. 12E is a schematic drawing of a switching stack structure.

FIGS. 12G and 12H are plots showing $R_H$ loops of the Ta underlayer sample due to dc current sweep in presence of constant bias field along the current channel.

FIG. 13A is an HAADF-STEM image for sample BS8.

FIGS. 13B-13H are individual-element EDX line scans for Bi—Se composition for sample BS8, normalized for visibility.

FIGS. 14A and 14B are EDX composite maps for samples BS4 and BS8, respectively, scaled for atomic percent of each element.

FIGS. 14C and 14D are plots of EDX line scan data for Bi:Se composition for samples BS4 and BS8, respectively (line scan data corresponds to white arrows in 14A and 14B, respectively).

FIG. 16A is a schematic diagram showing a stack structure and co-ordinate system for a magnetic stack including sample BS4.

FIG. 16B is a plot of the spin torque ferromagnetic resonance (ST-FMR) of sample BS4.

FIG. 16C is a plot of spin Hall angle (SHA) variation with excitation frequency of sample BS4.

FIG. 16D is a plot of frequency versus resonance field for sample BS4.

FIG. 17A is a schematic drawing of a $Bi_xSe_{(1-x)}$ switching sample stack structure.

FIG. 17B is a plot of $R_{AHE}$ measured in the $Bi_xSe_{(1-x)}$ switching sample using a 50 µA current.

FIGS. 17C and 17D are plots of current-induced switching of the magnetization due to SOT arising from the $Bi_xSe_{(1-x)}$ underlayer in the presence of a constant 8 mT in-plane bias field measured in Hall cross bar with dimensions 15 µm×70 µm.

FIG. 18A is a schematic drawing of a Ta switching sample stack structure.

FIG. 18B is a plot of $R_{AHE}$ measured in the Ta switching sample using a 50 µA current.

FIGS. 18C and 18D are plots of current-induced switching of the magnetization due to SOT arising from the Ta underlayer in the presence of a constant 8 mT in-plane bias field measured in Hall cross bar with dimensions 15 µm×70 µm.

DETAILED DESCRIPTION

Figure 1:
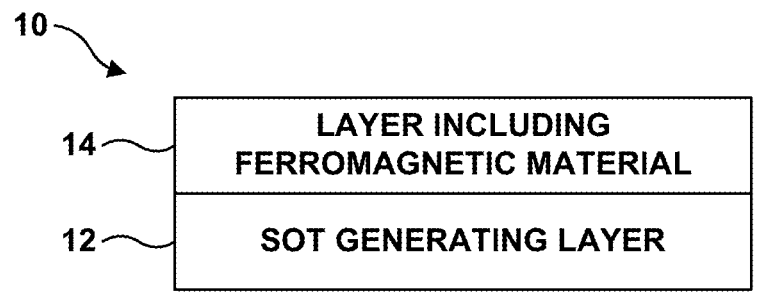
FIG. 1 is a conceptual schematic diagram of an example device that includes a magnetic heterostructure including a spin-orbit torque generating layer that includes at least one of $Bi_xSe_{(1-x)}$, $Bi_xTe_{(1-x)}$, or $Sb_xTe_{(1-x)}$ and a layer including a ferromagnetic material.

The materials, devices, and techniques described in this disclosure can be used in spintronics memory and logic devices. The materials may include at least one of $Bi_xSe_{(1-x)}$, $Bi_xTe_{(1-x)}$, or $Sb_xTe_{(1-x)}$, where x is greater than 0 and less than 1. In some examples, the materials include $Bi_xSe_{(1-x)}$, and x is not 0.4. In some examples, the material exhibits a Spin Hall Angle of greater than 3.5 at room temperature (e.g., between about 20° C. and about 25° C., such as about 23° C.), where the Spin Hall Angle is defined as a ratio of the spin current generated to the charge current injected into the material. In some examples, the material may be referred to as a spin-orbit torque (SOT) generating material.

The SOT generating materials, devices, and techniques are compatible with existing state-of-the-art complementary metal-oxide-semiconductor (CMOS) technology. For example, the SOT generating materials described herein may be formed on silicon or other semiconductor substrates, and may be deposited with sufficiently low surface roughness to allow use in CMOS devices (e.g., to allow formation of other layers on the SOT generating materials). In addition, the SOT generating materials, devices, and techniques may bring low power consumption to existing devices, e.g., due to relatively high Spin Hall Angle, relatively low switching current density, or both.

The SOT generating materials, devices, and techniques can be used with or incorporated in spintronic devices. In general, the SOT generating materials, devices, and techniques may be used with or incorporated in magnetic heterostructures. Magnetic heterostructures include multilayer materials that exhibit physical properties different from any of the constituent layers alone. magnetic heterostructures described herein may include at least one layer that includes the SOT generating materials described herein, and at least one other layer. The at least one other layer may include, for example, a ferromagnetic material. The SOT generating materials may be used to manipulate magnetization of the ferromagnetic material using SOT.

In some examples, the SOT generating materials, devices, and techniques may be used with or incorporated in a magnetic tunnel junction (MTJ) device. By integrating the SOT generating materials described herein with a MTJ device such as spin transfer torque magnetic random access memory (STT-RAM), the MTJ device may be power efficient and may also have an increased operating life time. In a MTJ device that utilizes the SOT generating materials described herein, the total charge current passed in the device is divided into the SOT generating material and the MTJ. The SOT induced from the SOT generating material and the spin transfer torque (STT) from the current through MTJ can switch a free layer of the MTJ.

In some examples, the SOT generating materials, devices, and techniques may be used with or incorporated in a magnetic domain wall based memory or logic device. For example, in a magnetic domain wall based memory device, the SOT generating material can be placed under the magnetic layer. Since the resistivity of the SOT generating material is relatively large, most of the injected current passes through the magnetic layer, which produces STT, and a small current passes through the SOT generating material, which produces SOT. STT itself can move domain wall; however, incorporating the SOT generating material and utilizing SOT may cause the domain wall to move faster than devices that utilize only STT.

The SOT generating materials described herein may produce relatively large SOT, which can be used to switch in- or out-of-plane magnetization efficiently. In some devices that utilize a ferromagnetic insulator as a magnetic layer, the SOT generating material can produce large SOT with a small current, reducing power consumption. In some devices, such as magnetic domain wall based logic devices or memory devices, SOT and STT together produce large domain wall velocity, which may increase operating speeds of magnetic domain wall based logic devices or memory devices.

SOT from large spin-orbit coupling materials has been attracting interest because SOT may facilitate low power switching of the magnetization of magnetic materials and facilitate fast domain wall motion that can be used in future spin-based memory and logic devices. SOT in spin Hall materials (SHMs)/ferromagnet (FM) heterostructures is of great interest due to its efficient switching of magnetization in spin based memory and logic devices. SOT has been calculated theoretically and observed experimentally in heavy metals and topological insulators. SOT can be generated by injecting an in-plane charge current in to a SHM/FM/Oxide heterostructure. The charge current is scattered in the stack direction depending upon the spin orientation of electrons due to the spin Hall effect (SHE) or Rashba effect. In SHMs/FM/Oxide heterostructures, the spin-polarized current accumulated at the interface between SHM and FM transfers spin angular momentum to the magnetization of the FM, which can rotate the magnetization of the FM. The torque which rotates the magnetization due to the transfer of spin angular momentum is known as SOT.

Conventionally, spin polarized current is generated by using a ferromagnetic polarizer that transfers its spin angular momentum to a non-collinear FM. Because of transfer of the spin angular momentum, the magnetization of non-collinear FM can be rotated. The associated torque which rotates magnetization of the non-collinear FM is called STT. STT-based commercial devices, including STT-MRAM, use MTJs as its building blocks. Although STT-MRAM is an upgrade to existing RAM in terms of non-volatility, scalability, and low power use, STT-MRAM is still not sufficiently durable or reliable. Current STT-MRAM uses large current density for writing (which can potentially break down tunneling junction barriers) and is unreliable due to the potential change in the magnetic state by read current. In addition, STT-MRAM is not power efficient because of the low efficiency of the ferromagnetic polarizer. SOT-based memory and logic devices are superior to STT based devices because SOT-based memory and logic devices don't require a polarizer for spin-polarized current; SOT-based memory and logic devices only use a relatively small current density for switching magnetization; SOT-based memory and logic devices are scalable; and SOT-based memory and logic devices are also reliable after using different current paths for writing and reading.

The most commonly studied SOT generators in SHM/FM heterostructures are heavy metals such as Ta, W, Pt, and topological insulators such as $Bi_2Se_3$ or $(Bi_{0.5}Sb_{0.5})_2Te_3$. Heavy metals have relatively low electrical resistivity and are easier to grow that topological insulators; however, it has been reported that a current density of the order of $10^6$-$10^8$ A/cm$^2$ is needed to switch the magnetization of a FM using heavy metal SOT generators. In the case of topological insulators as SOT generators, switching of the magnetization at 1.9 K was observed with current density of $8.9 \times 10^4$ A/cm$^2$.

This disclosure describes $Bi_xSe_{(1-x)}$ films as a SOT generator. In some examples, the $Bi_xSe_{(1-x)}$ films may be grown using magnetron sputtering, atomic layer deposition, chemical vapor deposition, or electrochemical deposition. The switching of perpendicular magnetization using SOT from the $Bi_xSe_{(1-x)}$ film may yield a relatively low switching current density at room temperature (e.g., between about 20° C. and about 25° C., such as about 23° C.). The dc planar Hall method was used for the characterization of the SOT generated by the $Bi_xSe_{(1-x)}$ film. The spin Hall angle of the $Bi_xSe_{(1-x)}$ thin film at room temperature may be greater than other materials described above, such as greater than about 3.5, greater than 5, greater than 10, greater than 15, or greater than 20. In some examples, the spin Hall angle is approximately two orders of magnitude larger than that of heavy metals and about one order larger than that of $Bi_2Se_3$. Moreover, spin Hall conductivity of the $Bi_xSe_{(1-x)}$ film is comparable or larger than the previously reported values of other SOT generators. The large spin Hall angles, low switching current density, and large spin Hall current at room temperature indicates the potential value of $Bi_xSe_{(1-x)}$, such as $Bi_xSe_{(1-x)}$ films grown on a silicon substrate by magnetron sputtering, as SOT generators in spin-based memory and logic devices. While the description primarily describes $Bi_xSe_{(1-x)}$ as a SOT generator, other materials may perform similarly. For example, $Bi_xTe_{(1-x)}$, or $Sb_xTe_{(1-x)}$, or mixtures including at least two of $Bi_xSe_{(1-x)}$, $Bi_xTe_{(1-x)}$, or $Sb_xTe_{(1-x)}$ may be used as a SOT generator.

FIG. 1 is a conceptual schematic diagram of an example device that includes a magnetic heterostructure 10 including a spin-orbit torque (SOT) generating layer 12 that includes at least one of $Bi_xSe_{(1-x)}$, $Bi_xTe_{(1-x)}$, or $Sb_xTe_{(1-x)}$ and a layer 14 including a ferromagnetic material. Magnetic heterostructure 10 may be any device in which the layers 12 and 14 together exhibit physical properties different than SOT generating layer 12 and layer 14 do separately. For example, magnetic heterostructure 10 may include a magnetic tunnel junction structure, a giant magnetoresistance structure, or the like. In some examples, magnetic heterostructure 10 may be a logic or memory device that functions based on magnetic orientation of layer 14.

Layer 14 may include a ferromagnetic material. Example ferromagnetic materials include Fe, Co, Ni, FePd, FePt, [Co/Pd]$_n$ multilayers, [Co/Ni]$_n$ multilayers, [Co/Pt]$_n$ multilayers, MnBi, MnSb, FeCo, CoFeB, Heusler alloys, $Nd_2Fe_{14}B$, $SmCo_5$, $Sm(Co,Fe,Cu,Zr)_7$, Alnico (alloys of Al, Ni, and Co), or the like.

SOT generating layer 12 may include at least one of $Bi_xSe_{(1-x)}$, $Bi_xTe_{(1-x)}$, or $Sb_xTe_{(1-x)}$, where x is greater than 0 and less than 1. $Bi_xSe_{(1-x)}$, $Bi_xTe_{(1-x)}$, and $Sb_xTe_{(1-x)}$ may exhibit a Spin Hall Angle of greater than about 3.5 at room temperature, which is may be greater than other SOT materials, such as $Bi_2Se_3$. In some examples, $Bi_xSe_{(1-x)}$, $Bi_xTe_{(1-x)}$, and $Sb_xTe_{(1-x)}$ may exhibit a Spin Hall Angle of greater than about 5 at room temperature, greater than about 10 at room temperature, or greater than about 20 at room temperature.

In some examples, x is not 0.4. In some examples, x may be between about 0.45 and about 0.5, or may be about 0.47. In other words, in some examples, SOT generating layer 12 may include excess Bi or Sb compared to $Bi_2Se_3$, $Bi_2Te_3$, or $Sb_2Te_3$. The value of x for SOT generating layer 12 may be determined as an average throughout a volume of SOT generating layer 12.

In some examples, SOT generating layer 12 may include a concentration gradient. For example, SOT generating layer 12 may include more Bi or Sb in a first portion of SOT generating layer 12 than in a second portion of SOT generating layer 12. As an example, a portion of SOT generating layer 12 nearer to layer 14 may include less Bi or Sb than a portion of SOT generating layer 12 farther from layer 14. As another example, a middle portion of SOT generating layer 12 may include more Bi or Sb than portions of SOT generating layer 12 adjacent to the surfaces of SOT generating layer 12. In other words, SOT generating layer 12 may include a first region including at least one of $Bi_{x1}Se_{(1-x1)}$, $Bi_{x1}Te_{(1-x1)}$, or $Sb_{x1}Te_{(1-x1)}$, a second region including at least one of $Bi_{x2}Se_{(1-x2)}$, $Bi_{x2}Te_{(1-x2)}$, or $Sb_{x2}Te_{(1-x2)}$, and a third region including at least one of $Bi_{x2}Se_{(1-x2)}$, $Bi_{x3}Te_{(1-x3)}$, or $Sb_{x3}Te_{(1-x3)}$. The second region may be between the first region and the third region, and x2 may be greater than x1 and greater than x3.

In some examples, SOT generating layer 12 may optionally include a dopant. The dopant may be an element that is not already present in SOT generating layer 12 (e.g., not Bi or Se in examples in which SOT generating layer 12 includes $Bi_xSe_{(1-x)}$). The dopant may include, for example, at least one of In, Sn, Bi, Se, Te, Au, Ag, Cu, Ti, V, Fe, Mn, Cr, Co, Ni, Gd, Tb, Sm, Nd, Eu, Dy, or Ho.

SOT generating layer 12 may include a polycrystalline microstructure. For example, SOT generating layer 12 may include a plurality of grains. In some examples, an average grain size of the plurality of grains may be between about 3 nanometers and about 15 nanometers. In some examples, crystalline axes of the grains may be canted at a non-perpendicular angle to a major surface of SOT generating layer 12. For example, on average, c-axes of the grains may be canted at an angle of 2°±9° to perpendicular. A relatively small grain size, such as between about 3 nanometers and about 15 nanometers, may affect the band structure of the SOT generating layer 12 and enhance spin accumulation compared to some SOT generating layers that have larger grain sizes, even in materials, such as $Bi_xSe_{(1-x)}$ that may not exhibit spin Hall effect when including relatively larger grain sizes. This may contribute to relatively large spin Hall angle.

SOT generating layer 12 may define any desired thickness, depending on other layers in magnetic heterostructure 10. In some examples, SOT generating layer 12 may define a thickness between about 4 nm and about 50 nm, or between about 4 nm and about 20 nm, or between about 4 nm and about 16 nm, or about 4 nm, or about 5 nm, or about 8 nm, or about 10 nm, or about 16 nm, or about 20 nm, or about 40 nm, or about 50 nm.

In some examples, SOT generating layer 12 may have a relatively low surface roughness. A relatively low surface roughness may facilitate incorporation of SOT generating layer 12 into magnetic heterostructures in which another layer of the magnetic heterostructure functions more effectively when smoother. For example, an MgO interlayer in a magnetic tunnel junction may function more effectively when relatively smooth. In some examples, SOT generating layer 12 may define an average surface roughness of than about 5% of a thickness of the spin-orbit torque generating layer. For example, SOT generating layer 12 may define an average surface roughness of less than or equal to about 2 nm, or less than or equal to about 0.6 nm.

During use of magnetic heterostructure 10, a current may be conducted through magnetic heterostructure 10 to affect magnetic orientation of ferromagnetic layer 14. Due to the resistivity of the $Bi_xSe_{(1-x)}$, $Bi_xTe_{(1-x)}$, or $Sb_xTe_{(1-x)}$, material in SOT generating layer 12, almost all of the current may flow through layer 14 that includes the ferromagnetic material, which can change magnetic orientation due to STT alone. Due to the large resistivity, the current in SOT generating layer 12 may flow on the order of micro-amps, which may be sufficient to produce large SOT. A combination of STT and SOT may change magnetic orientation of layer 14 faster than previously observed.

In some examples, SOT generating layer 12 may be formed using a sputtering technique, atomic layer deposition, chemical vapor deposition, or electrochemical deposition. In sputtering techniques, energetic ions produced in a glow discharge bombard a material source, also referred to as the target or cathode, and cause the removal of atoms from the material source. These sputtered atoms can then condense onto a substrate or any other surfaces in the deposition chamber in which the sputtering technique is performed. Like any glow discharges, secondary electrons are also emitted by the material source upon positive ion bombardment or neutral atom bombardment, and these electrons play an essential role in the conservation of discharge current and the sustaining of the glow discharge.

Some sputtering techniques utilize magnetrons. Magnetrons utilize the fact that electrons follow magnetic field lines and are confined in the directions transverse to the magnetic field lines, circling around the magnetic field lines with a radius of gyration. In magnetron sputtering, the magnets are arranged within the deposition chamber in a way such that one pole is positioned on the central axis of the material source and the other pole is a ring magnet around an outer periphery of the material source. Electrons are then trapped by the magnetic field, causing more ionizations and resulting in a denser plasma. This, in turn, leads to more ions bombarding the material source, higher sputtering rates, and higher deposition rates. Moreover, the increased ionization rate allows the plasma to be maintained at lower pressures, usually around a few mTorr (e.g., between about 1 mTorr and about 100 mTorr). Lower pressures decrease the number of collisions or the possibility of collisions for sputtered atoms and, therefore, may increase a deposition rate or reduce defects in the deposited material. In some examples, the material source may include a mixture or alloy of Bi and Se, such as $Be_2Se_3$.

Figure 2:
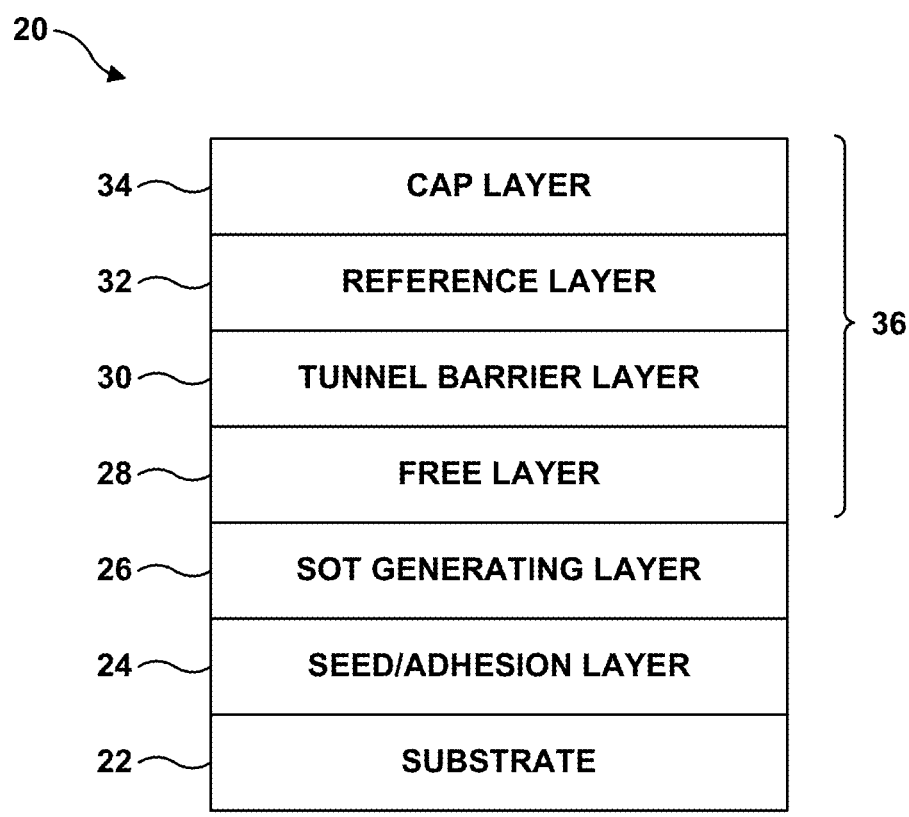
FIG. 2 is a conceptual schematic diagram of an example device that includes a spin-orbit torque generating layer that includes at least one of $Bi_xSe_{(1-x)}$, $Bi_xTe_{(1-x)}$, or $Sb_xTe_{(1-x)}$ and a magnetic tunnel junction.

The SOT generating materials described herein may be utilized in other magnetic heterostructures. For example, FIG. 2 is a conceptual schematic diagram of an example device 20 that includes a spin-orbit torque generating layer 24 that includes at least one of $Bi_xSe_{(1-x)}$, $Bi_xTe_{(1-x)}$, or $Sb_xTe_{(1-x)}$ and a magnetic tunnel junction 36. Device 20 may include a substrate 22. In some examples, substrate 22 may include a semiconductor, such as silicon, germanium, silicon carbide, boron nitride, boron phosphide, boron arsenide, gallium arsenide, or the like. In some examples, substrate 22 may include multiple layers, such as a bulk layer and an oxide layer on the bulk layer. For example, substrate 22 may include silicon and a silica layer on the silicon.

Device 20 also may include a seed layer or adhesion layer 24 on substrate 22. The seed layer or adhesion layer 24 may increase adhesion of overlying layers to substrate 22. In some examples, the seed layer or adhesion layer 24 additionally or alternatively may act as a template establishing a preferred crystal growth direction, spacing, or the like, for an overlying. For example, seed layer or adhesion layer 24 may include MgO, Bn, Ta, AlN, SiN, $TiO_2$, $Ta_xO_y$, HfO, or the like, which may improve adhesion of $Bi_xSe_{(1-x)}$, $Bi_xTe_{(1-x)}$, or $Sb_xTe_{(1-x)}$ to substrate 22, such as silicon or silica, may establish a preferred crystal growth direction, spacing, or the like for $Bi_xSe_{(1-x)}$, $Bi_xTe_{(1-x)}$, or $Sb_xTe_{(1-x)}$, or both.

Device 20 also includes SOT generating layer 26. SOT generating layer may be similar or substantially the same as SOT generating layer 12 described with respect to FIG. 1. For example, SOT generating layer 26 may include at least one of $Bi_xSe_{(1-x)}$, $Bi_xTe_{(1-x)}$, or $Sb_xTe_{(1-x)}$. $Bi_xSe_{(1-x)}$, $Bi_xTe_{(1-x)}$, and $Sb_xTe_{(1-x)}$ may exhibit a Spin Hall Angle of greater than about 3.5 at room temperature, greater than about 5 at room temperature, greater than about 10 at room temperature, or greater than about 20 at room temperature.

In some examples, x is not 0.4. For example, x may be greater than 0.4, such as between about 0.45 and about 0.5, or about 0.47.

In some examples, SOT generating layer 26 may include a concentration gradient. For example, SOT generating layer 26 may include more Bi or Sb in a first portion of SOT generating layer 26 than in a second portion of SOT generating layer 26. As an example, a portion of SOT generating layer 26 near magnetic tunnel junction 36 may include less Bi or Sb than a portion of SOT generating layer 26 farther from magnetic tunnel junction 36. As another example, a middle portion of SOT generating layer 26 may include more Bi or Sb than portions of SOT generating layer 26 adjacent to the surfaces of SOT generating layer 26.

In some examples, SOT generating layer 26 may optionally include a dopant such as, for example, at least one of In, Sn, Bi, Se, Te, Au, Ag, Cu, Ti, V, Fe, Mn, Cr, Co, Ni, Gd, Tb, Sm, Nd, Eu, Dy, or Ho.

SOT generating layer 26 may include a polycrystalline microstructure. For example, SOT generating layer 26 may include a plurality of grains. In some examples, an average grain size of the plurality of grains may be between about 5 nanometers and about 15 nanometers. In some examples, crystalline axes of the grains may be canted at a non-perpendicular angle to a major surface of SOT generating layer 26. For example, on average, c-axes of the grains may be canted at an angle of 2°±9° to perpendicular.

SOT generating layer 26 may define any desired thickness, depending on other layers in device 20, and the relative positioning of the layers. In some examples, SOT generating layer 26 may define a thickness between about 4 nm and about 50 nm, or between about 4 nm and about 20 nm, or between about 4 nm and about 16 nm, or about 5 nm, or about 10 nm, or about 20 nm, or about 50 nm.

In some examples, SOT generating layer 26 may have a relatively low surface roughness. A relatively low surface roughness may facilitate incorporation of SOT generating layer 26 into device 20, in which additional functional layers are formed on SOT generating layer 26. For example, an MgO interlayer 30 in magnetic tunnel junction 36 may function more effectively when relatively smooth. In some examples, SOT generating layer 26 may define an average surface roughness of than about 5% of a thickness of the SOT generating layer 26. For example, SOT generating layer 26 may define an average surface roughness of less than or equal to about 2 nm, or less than or equal to about 0.6 nm.

Device 20 also may include a magnetic tunnel junction 36 on SOT generating layer 26. Magnetic tunnel junction 36 may include free layer 28 on SOT generating layer 26, a tunnel barrier layer 30 on free layer 28, a reference or fixed layer 32 on tunnel barrier layer 30, and a cap layer 34 on reference layer 32. Free layer 28 may include a ferromagnetic or ferrimagnetic material, which has a magnetic moment that can be caused to change orientation under application of a sufficient magnetic field, STT, or SOT. Free layer 28 may include a magnetic easy axis, which defines two antiparallel directions along which the magnetic moment may rest in the absence of an applied magnetic field, STT, or SOT. The magnetic easy axis may be substantially parallel to a major surface of free layer 28 substantially perpendicular to a major surface of free layer 28, or canted out of the plane of free layer 28 at an angle between substantially parallel and substantially perpendicular.

Free layer 28 may include any suitable ferromagnetic or ferrimagnetic material, including, for example, an Fe-based, Ni-based, or Co-based material. For example, free layer 28 may include an FeCo alloy, an FeCoB alloy, an FePd alloy, an FePt alloy, a Heusler alloy, a [Co/Pd]$_n$ multilayer, a [Co/Ni]$_n$ multilayer, a [Co/Pt]$_n$ multilayer, or the like.

Free layer 28 may define any suitable thickness, such as between about 1 nm and about 10 nm, or about 5 nm.

Device 20 also includes tunnel barrier layer 30, which is part of magnetic tunnel junction 36. Tunnel barrier layer 30 may include an electrically insulating material, such as MgO, though which electrons must tunnel to conduct charge from free layer 28 to reference layer 32. Tunnel barrier layer 30 may define a thickness on the order of single digit nanometers, such as about 2 nm.

Reference layer 32 includes a ferromagnetic or ferrimagnetc material whose magnetic moment is substantially fixed for magnetic fields, STT, and SOT to which reference layer 32 is exposed during operation of device 32. In some examples, reference layer 32 may include multiple layers, such as a ferromagnetic or ferrimagnetic layer antiferromagnetically coupled to an antiferromagnetic layer. The ferromagnetic or ferrimagnetic layer may include any of the materials described above with reference to free layer 28.

Free layer 28 may define any suitable thickness, such as between about 1 nm and about 10 nm, or about 5 nm.

Cap layer 34 may include any suitable material and any suitable thickness, and may include a material suitable for electrically connecting to an electrode or electrical contact. In some examples, cap layer 34 may include tantalum.

In some examples, rather than free layer 28 being on a bottom of magnetic tunnel junction 36 (e.g., closest to substrate 22), free layer 28 may be on a top of magnetic tunnel junction 36. For example, reference layer 32 may be on substrate 22 or seed layer 24, tunnel barrier layer 30 may be on reference layer 30, free layer 28 may be on tunnel barrier layer 30, and SOT generating layer 26 may be on free layer 28. This may facilitate formation of a smooth tunnel barrier layer 30, which may improve tunneling behavior compared to a rough tunnel barrier layer.

Figure 3:
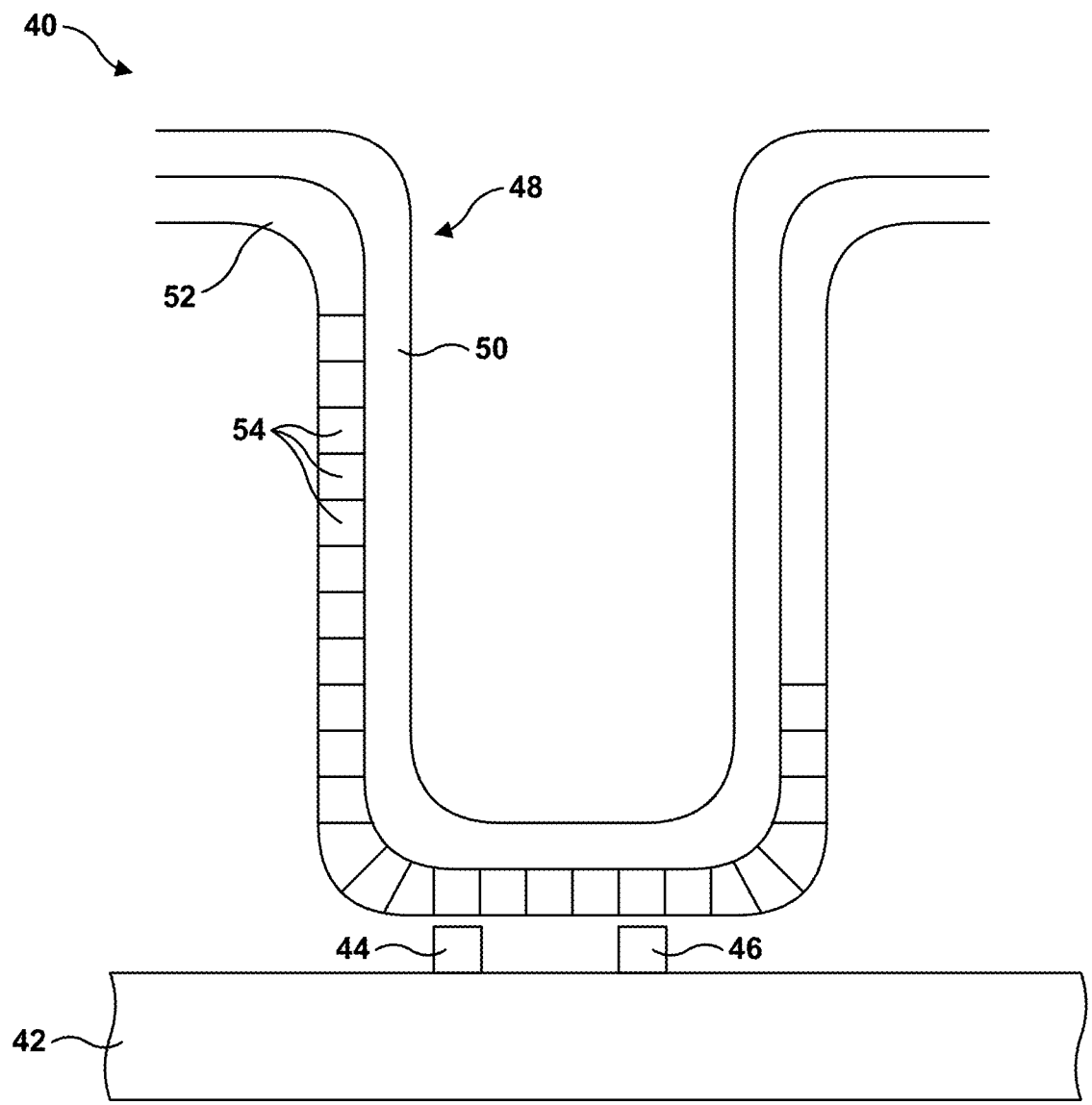
FIG. 3 is a conceptual schematic diagram of an example device that includes a magnetic domain wall based memory device including a spin-orbit torque generating layer that includes at least one of $Bi_xSe_{(1-x)}$, $Bi_xTe_{(1-x)}$, or $Sb_xTe_{(1-x)}$.

In other examples, a SOT generating material may be incorporated in a domain wall based memory or logic device. FIG. 3 is a conceptual schematic diagram of an example magnetic domain wall based memory device 40 including a SOT generating layer 50 that includes at least one of $Bi_xSe_{(1-x)}$, $Bi_xTe_{(1-x)}$, or $Sb_xTe_{(1-x)}$. Magnetic domain wall based memory device 40 may also be referred to as racetrack memory, and includes a storage wire or ribbon 48, a write element 44 and a read element 46.

Magnetic domain wall based memory device 40 also includes a substrate 42, which may include a semiconductor and, optionally an overlying oxide or dielectric layer, as described above with reference to FIG. 2.

Write element 44 may include any device capable of writing data to storage wire or ribbon 48 by generating a magnetic field that affects orientation of magnetic moments of magnetic domains 54. Similarly, read element 46 may include any device capable of reading data from storage wire or ribbon 48 by sensing magnetic fields generated by magnetic moments of magnetic domains 54.

Storage wire or ribbon 48 includes SOT generating layer 50 and a ferromagnetic layer 52. Ferromagnetic layer 52 may be divided into a plurality of magnetic domains 54, only some of which are labeled in FIG. 3, by intentional geometrical or compositional defects in ferromagnetic layer 52. Ferromagnetic layer 52 may include any of the ferromagnetic materials listed herein, or other suitable ferromagnetic materials.

SOT generating layer 50 is adjacent to ferromagnetic layer 52. SOT generating layer 50 may include any of the SOT generating materials described herein, including those described with respect to FIGS. 1 and 2.

To read data from or write data to magnetic domains 54, domain walls may be moved between adjacent magnetic domains 54 using spin-polarized current. The direction of movement may be controlled by the polarity of the spin-polarized current. Due to the resistivity of the $Bi_xSe_{(1-x)}$, $Bi_xTe_{(1-x)}$, or $Sb_xTe_{(1-x)}$, material in SOT generating layer 50, almost all of the current may flow through ferromagnetic layer 52, which can move domain walls due to STT alone. Due to the large resistivity, the current in SOT generating layer 50 may flow on the order of micro-amps, which may be sufficient to produce large SOT. A combination of STT and SOT may move domains walls within ferromagnetic layer 52 faster than previously observed.

$Bi_xSe_{(1-x)}$ films with a thickness of 4 nm, 10 nm, 20 nm, and 50 nm, respectively, were sputtered on a silicon substrate that included a silica ($SiO_2$) layer and a 2 nm MgO layer as an adhesion layer. The thin films were grown on the Si/$SiO_2$/MgO substrate by sputtering of a composite $Bi_2Se_3$ (99.99% pure) material source in an ultra-high vacuum (UHV) six-target Shamrock sputtering system with a base pressure of 5.0×10⁻⁸ Torr at room temperature. The Bi$_2$Se$_3$ material source was sputtered at 50 Watt power, yielding a deposition rate of 0.7 Å/s at 3 mTorr Ar pressure. MgO was rf sputtered at 2 mTorr Ar pressure with a deposition rate 0.07 Å/s. For comparative examples and other layers of the MTJ stack, Ta, CoFeB, and Gd were dc sputtered at 3 mTorr Ar pressure.

The thin-film samples were cross-sectioned using an FEI Quanta 200 3D dual-beam focused ion beam (FIB) and then analyzed using high-angle annular dark-field scanning transmission electron microscopy (HAADF-STEM). For STEM measurements, an aberration-corrected (using a CEOS DCOR probe corrector) FEI Titan G2 60-300 S/TEM equipped with a Schottky X-FEG gun was used, operated at 200 kV and a convergence angle of 16 mrad. Energy-dispersive X-ray spectroscopy (EDX) data was collected using a Super-X quad-SDD windowless in-pole piece EDX detector. EDX line scans were analyzed using Bruker Esprit software. Four point probe and vibrating sample magnetometry (VSM) were used to measure resistivity and saturation magnetization, respectively.

Figure 4A:
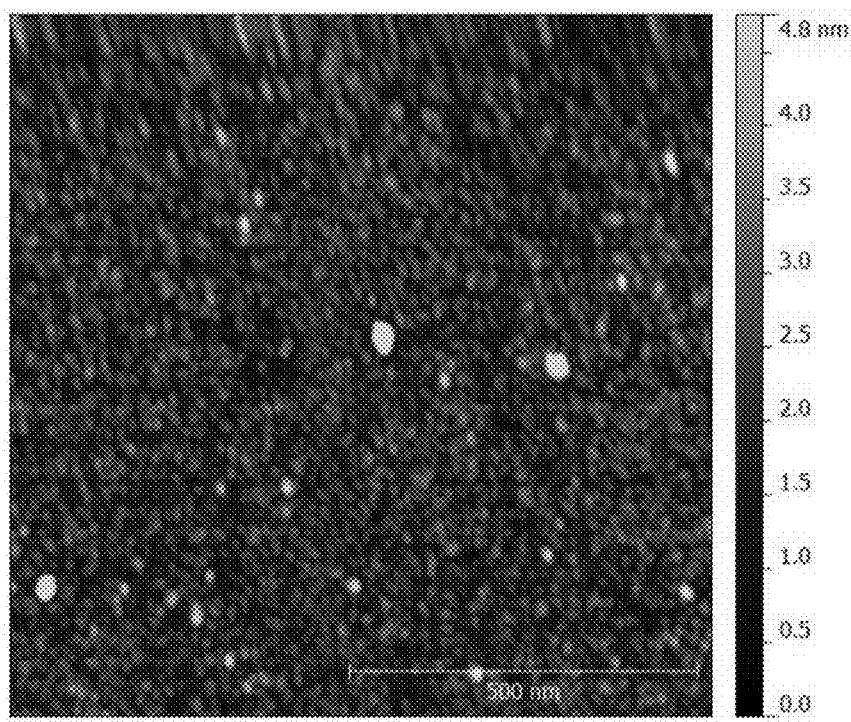
FIGS. 4A-4D are atomic force microscopy scans of $Bi_xSe_{(1-x)}$ only and $Bi_xSe_{(1-x)}$ with a full stack.
Figure 4B:
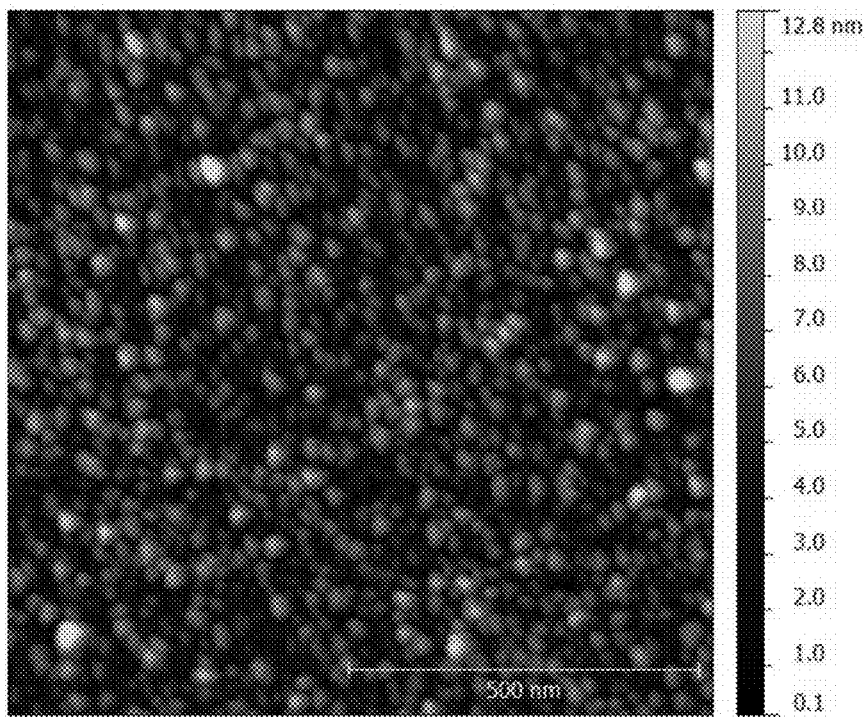
Figure 4C:
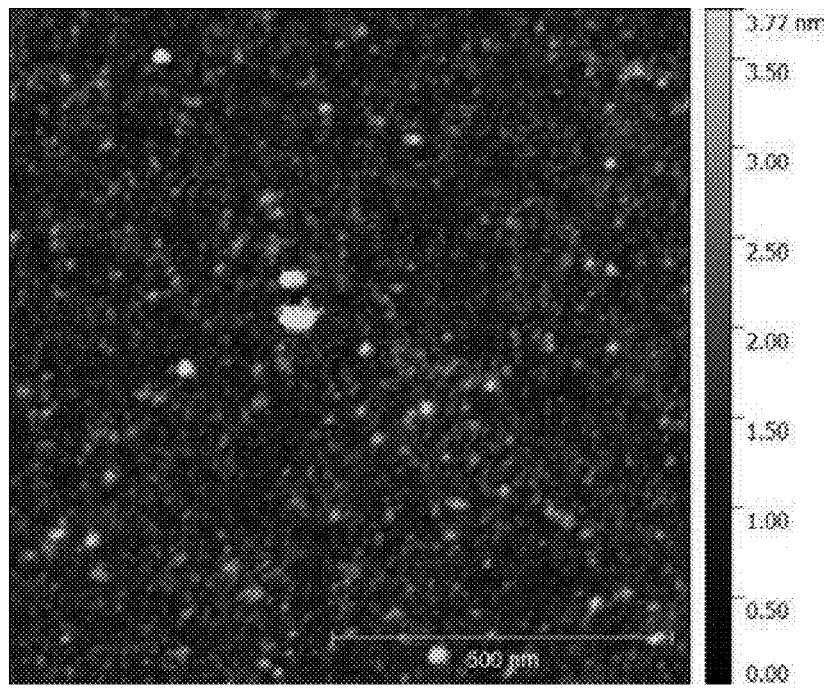
Figure 4D:
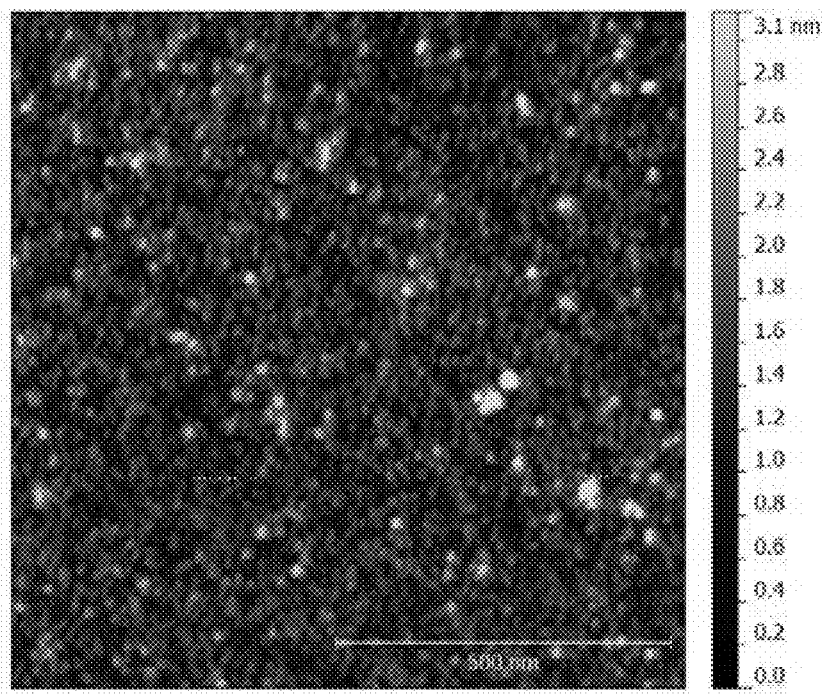

The resistivities of the Bi$_x$Se$_{(1-x)}$ films were found to be 1.67×10⁴ μΩ*cm for the 5 nm film, 2.70×10³ μΩ*cm for the 10 nm film, 2.05×10³ μΩ*cm for the 20 nm film, and 1.60×10³ μΩ*cm for the 50 nm film, respectively. In comparison, resistivity of a 5 nm film of CoFeB is about 160 μΩ*cm and resistivity of a 5 nm film of Ta is about 197 μΩ*cm. The root mean square (RMS) surface roughness values measured using atomic force microscopy (AFM) were 0.60 nm for the 10 nm Bi$_x$Se$_{(1-x)}$ film and 1.90 nm for the 50 nm Bi$_x$Se$_{(1-x)}$ film. In addition, the grains in the 50 nm Bi$_x$Se$_{(1-x)}$ film were larger than those in the 10 nm Bi$_x$Se$_{(1-x)}$ film as shown in FIGS. 4A-4D. FIGS. 4A-4D are AFM scans of Bi$_x$Se$_{(1-x)}$ only and Bi$_x$Se$_{(1-x)}$ with full stack. FIGS. 4A and 4B are AFM scans of 10.0 nm and 50.0 nm thick Bi$_x$Se$_{(1-x)}$ films, respectively. The RMS values of the 10.0 nm and 50.0 nm Bi$_x$Se$_{(1-x)}$ films are 0.6 and 1.9 nm, respectively. FIGS. 4C and 4D are AFM scans of Bi$_x$Se$_{(1-x)}$ with a full stack. The full stack included an Si substrate, an SiO$_2$ layer on the substrate, an about 2 nm MgO layer on the SiO$_2$ layer, a Bi$_x$Se$_{(1-x)}$ layer on the MgO layer, an about 5 nm CoFeB layer on the Bi$_x$Se$_{(1-x)}$ layer, an about 2 nm MgO layer on the CoFeB layer, and an about 5 nm Ta layer on the MgO layer. The RMS values of the full stack with an about 5 nm Bi$_x$Se$_{(1-x)}$ layer and the full stack with an about 10 nm Bi$_x$Se$_{(1-x)}$ layer are 0.38 and 0.40 nm, respectively.

The 3D carrier concentrations of the 20 and 50 nm thick Bi$_x$Se$_{(1-x)}$ films were found to be 9.30 and 8.17×10²⁰/cm³, respectively, by using Hall measurements. FIG. 5A is a plot of Hall resistance versus applied magnetic field. The negative slope of the Hall resistance indicates that the majority of the carriers in the films were electrons.

In order to characterize the SOT from the Bi$_x$Se$_{(1-x)}$ films, thin film stacks with a structure of Si/SiO$_2$/MgO (about 2 nm)/Bi$_x$Se$_{(1-x)}$ (varying nm)/CoFeB (about 5 nm)/MgO (about 2 nm)/Ta (about 5 nm) were deposited, with the thickness of the Bi$_x$Se(1-x) layer being one of 5 nm, 10 nm, or 20 nm. A control sample was also prepared with a 5 nm thick Ta layer replacing the Bi$_x$Se$_{(1-x)}$ layer. Unless otherwise stated, the labelling BS5, BS10, BS20, and Ta will be used for the samples with the thickness of the Bi$_x$Se$_{(1-x)}$ layer=5, 10, 20 nm, and the control sample, respectively. The saturation magnetization of the CoFeB film was 1.24×10³ emu/cc, and the resistivities of the CoFeB and Ta 5 nm films were found to be 1.53×10² μΩ*cm and 2.00×10² μΩ*cm, respectively.

Energy dispersive x-ray spectroscopy (EDX) and Rutherford back scattering (RBS) were used for compositional analysis of Bi$_x$Se$_{(1-x)}$ films. FIGS. 6A and 6B are EDX composite maps for samples BS5 and BS10, respectively. FIGS. 6C and 6D are EDX line scans for Bi—Se composition for BS5 and BS10 samples, respectively. The composition of the films were found to be about 47:53 Bi:Se ratio with 3% uncertainty by using RBS. The EDX line scan shows that the ratio of Bi:Se has the same trend in both BS5 and BS10 samples. The upper interface of each Bi$_x$Se$_{(1-x)}$ film has stoichiometric Bi$_2$Se$_3$; however, the scan line moves vertically down in the film, the Bi concentration increases, then peaks, and then Bi concentration decreases near the lower surface (FIGS. 6C and 6D).

Figure 7A:
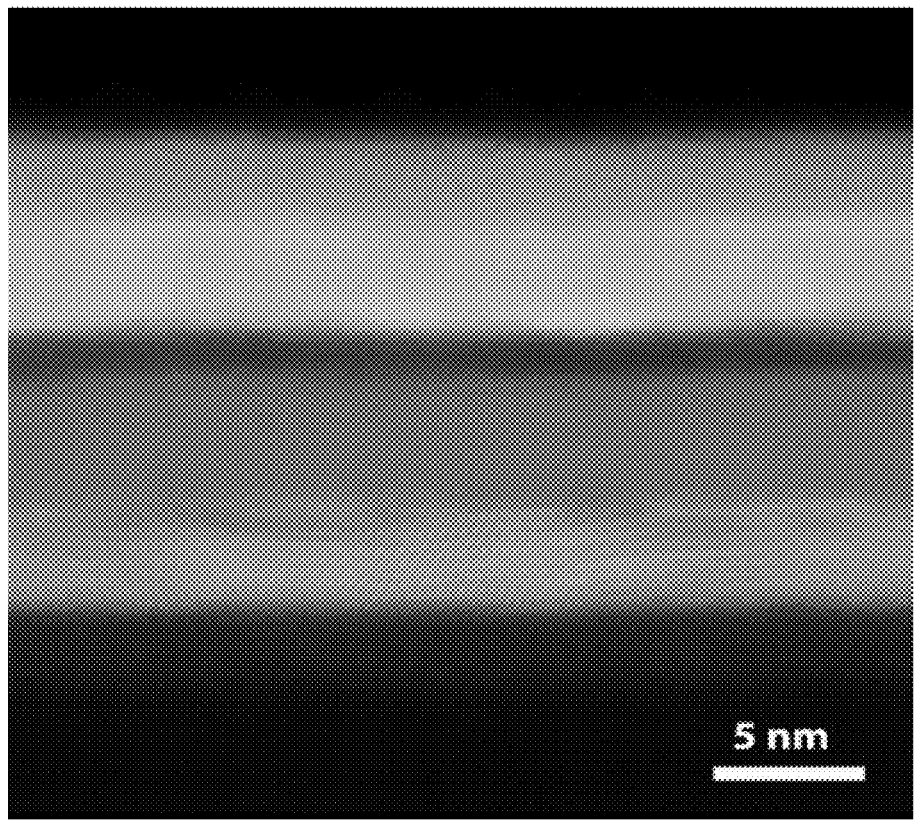
FIGS. 7A and 7B show the high-angle annular dark-field scanning transmission electron microscopy (HAADF-STEM) images of samples BS5 and BS10, respectively.
Figure 7B:
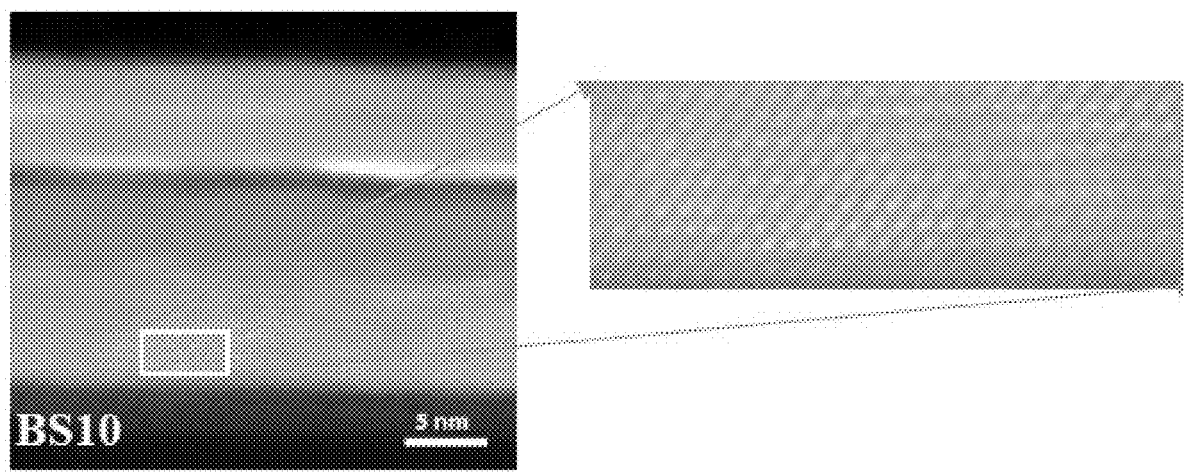

FIGS. 7A and 7B show the high-angle annular dark-field scanning transmission electron microscopy (HAADF-STEM) images of samples BS5 and BS10, respectively. The HAADF-STEM images show that Bi$_x$Se$_{(1-x)}$ has a polycrystalline structure and that the atomic layers of Bi and Se are continuous in both BS5 and BS10 samples. In addition, the average grain orientation in the BS5 sample is about 2°±9° (from vertical c-orientation), which is almost same as the average grain orientation in the BS10 sample)(2°±8°). However, the average size of grains in the BS5 sample is approximately 7 nm wide and 5 nm high, whereas the average size of grains in the BS10 sample is approximately 20 nm wide and 10 nm high. The HAADF-STEM images also show that the CoFeB layer has no lattice fringes, confirming that it is amorphous in both the samples.

To determine SOT from Bi$_x$Se$_{(1-x)}$/CoFeB (5 nm)/MgO system dc planar Hall method was used. The in-plane SOT exerted by the accumulated spin current on the interface of the Bi$_x$Se$_{(1-x)}$/CoFeB (5 nm) was obtained by using Slonczewski's equation:

$$\tau_{\parallel} = \frac{\hbar J_s}{2eM_s t}(\hat{m} \times (\hat{\sigma} \times \hat{m}))$$

where h is the reduced Planck's constant, J$_S$ is the spin polarized current density, e is an electronic charge, M$_s$ is the saturation magnetization, t is the thickness of the ferromagnetic layer, m is the magnetization unit vector, and σ is the spin polarized current accumulation unit vector. The associated out-of-plane magnetic field with the in-plane torque ($\tau_\mu$) is given by:

$$H_{OOP} = \frac{\hbar J_s}{2eM_s t}(\hat{\sigma} \times \hat{m})$$

Furthermore, the out-of-plane component of SOT is given by $$\tau_\perp = \alpha_T(\hat{m} \times \hat{\sigma})$$

where α$_T$ is a coefficient which determines the efficiency of current induced effects. The associated in-plane magnetic field with the out-of-plane torque ($\tau_\perp$) is given by $$H_T = \alpha_T \hat{\sigma}$$

Figure 5:
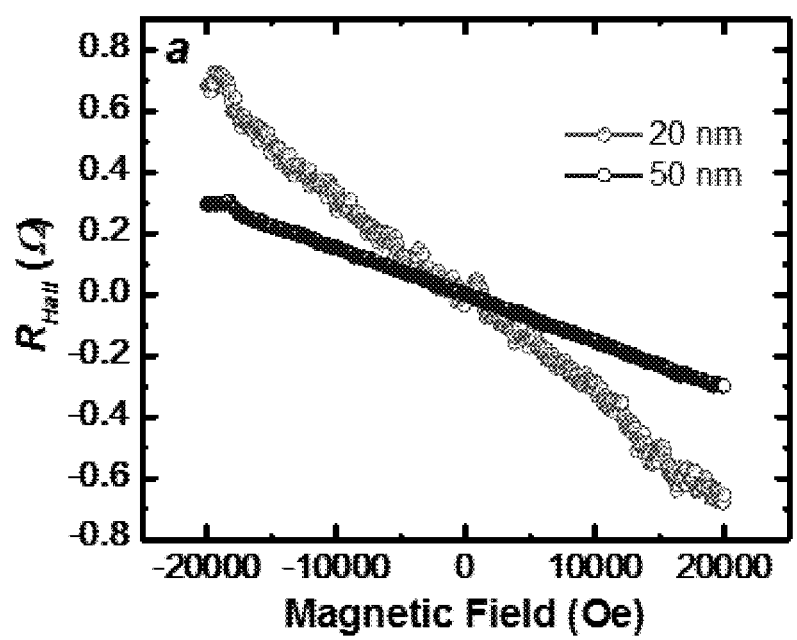
FIG. 5 is a plot of Hall resistance versus applied magnetic field.
Figure 8:
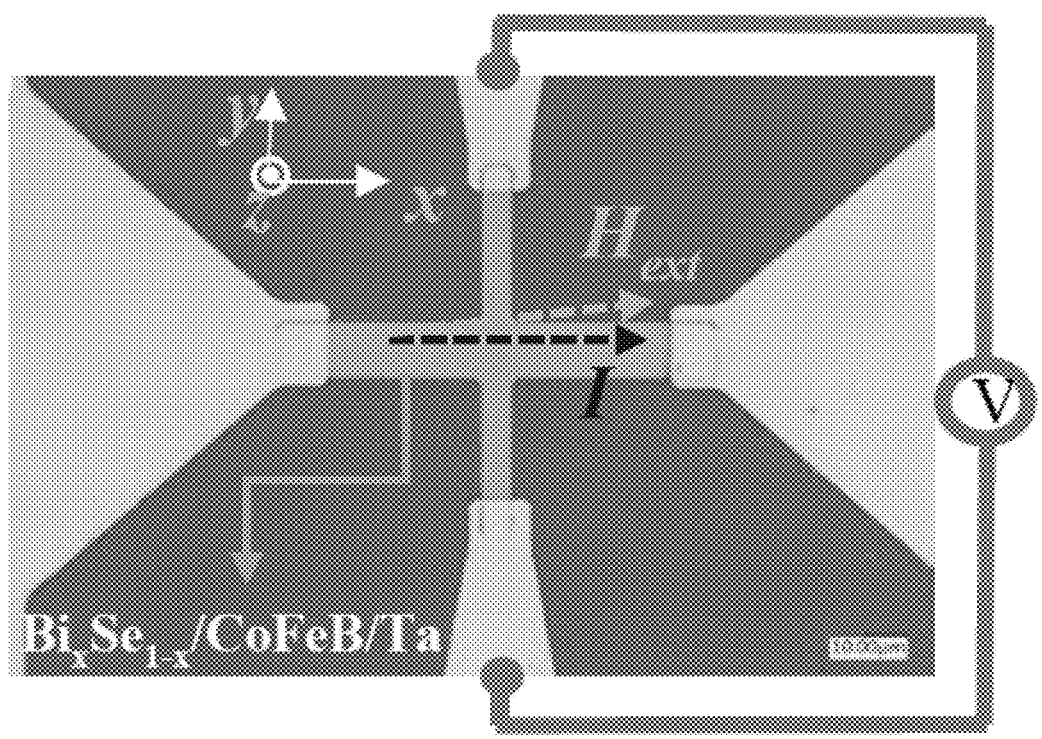
FIG. 8 is an optical micrograph of an example Hall cross bar with schematic drawings of the Hall measurement set up.

The films were patterned into Hall cross bars 5-30 μm wide and 70 μm long, and measurement was carried out on the bar with width 10 μm as shown in FIG. 5. FIG. 8 is an optical micrograph of an example Hall cross bar with schematic drawings of the Hall measurement set up. The Hall cross bars of width 5-30 μm and length 70 μm were fabricated by using standard optical lithography process, ion milling, a CHA evaporator, and lift off. After the first step of photolithography, the ion mill was used to define Hall cross bars and Ti (10 nm)/Au (120 nm) thick electrical contacts were placed after the second step of lithography. A four point probe was used to determine resistivity of the films. A physical property measurement system (PPMS) was used to measure electrical and magnetic properties of the bare $Bi_xSe_{(1-x)}$ films and the full stack structure with width 10 μm Hall cross bars.

Figure 10:
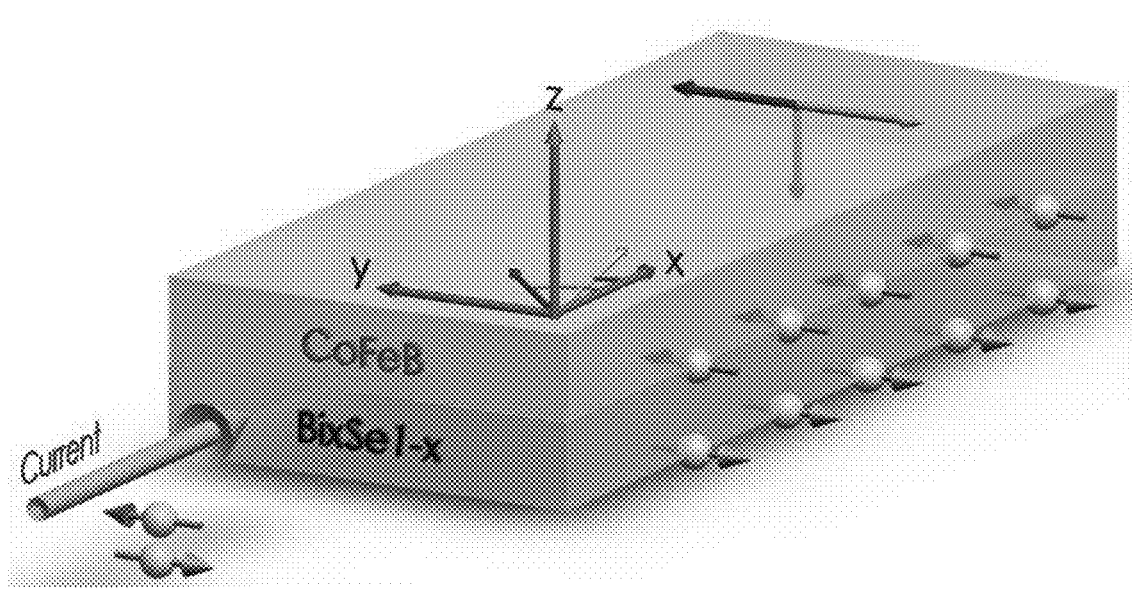
FIG. 10 is a three-dimensional schematic diagram of a $Bi_xSe_{(1-x)}$/CoFeB heterostructure, co-ordinate system, relative orientation of magnetization, external field input current, and current induced fields.
Figure 11A:
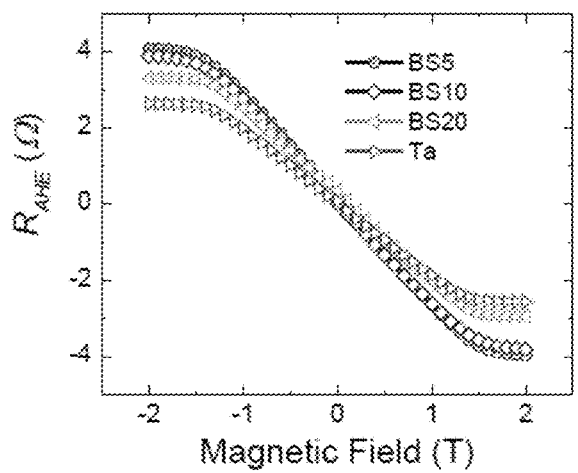
FIG. 11A is a plot of $R_{AHE}$ versus applied out-of-plane external magnetic field.

Bipolar current of magnitude up to 8.5 mA was injected along the x-direction shown in FIG. 8, and angle-dependent Hall resistance was measured under the application of a constant 0.5 T in-plane magnetic field while rotating the sample from −7° to 365°. FIGS. 9A and 9C show angle-dependent Hall resistance for the samples BS5 and Ta at ±8.5 mA bias current. In FIG. 9A, curve 72 is the angle-dependent Hall resistance for the sample BS5 at +8.5 mA bias current, curve 74 is the angle-dependent Hall resistance for the sample BS5 at −8.5 mA bias current, and curve 76 is the difference. In FIG. 9C, curve 92 is the angle-dependent Hall resistance for the sample Ta at +8.5 mA bias current, curve 94 is the angle-dependent Hall resistance for the sample Ta at +8.5 mA bias current, and curve 96 is the difference. The Hall resistance curve is linear with respect to the bias current and it shows 2-fold symmetry with extrema at about 45° in increments of 90. In principle, angle-dependent Hall resistance consists of planar Hall resistance ($R_{PHE}$) and anomalous Hall resistance ($R_{AHE}$) due to planar and anomalous Hall effects, respectively. The planar Hall resistance is due to the combined effects of the external field, current induced effective fields, and the anisotropy field acting on the magnetization ($R_{PHE} \propto \sin(2/\beta)$). The anomalous Hall resistance is due to the pulling of the magnetization in the out-of-plane direction by a current-induced effective field ($R_{AHE} \propto M_z$, where $M_z$ is the z-component of magnetization). The samples have an in-plane magnetic easy axis, so the current-induced effective fields are in transverse (HT) and out-of-plane (HOOP) directions as shown in FIG. 10. FIG. 10 is a three-dimensional schematic diagram of a $Bi_xSe_{(1-x)}$/CoFeB heterostructure, co-ordinate system, relative orientation of magnetization, external field input current, and current induced fields. In FIG. 10, $H_{ext}$ represents an in-plane externally applied field, M represents an in-plane magnetization, and $H_T$ and $H_{OOP}$ represent current induced transverse and out-of-plane magnetic fields, respectively. Moreover, α and β are angles made by the external field and the magnetization with respect to the x-axis To extract $H_T$ and $H_{OOP}$ current-induced effective fields, the angle-dependent Hall resistances for positive and negative bias currents were subtracted. The difference in Hall resistance is given by:

$$R_{DiffHall}(I, \alpha) = \\ R_{PHE}(I, \alpha) - R_{PHE}(-I, \alpha) + R_{AHE}(I, \alpha) - R_{AHE}(-I, \alpha) + C = \\ R_{PHE}(I, \alpha) - R_{PHE}(-I, \alpha) + 2\frac{dR_{AHE}}{dH}H_{OOP}\cos\alpha + C$$

where C is resistance offset, and $$\frac{dR_{AHE}}{dH}$$

is the change in the anomalous Hall resistance per unit externally applied out-of-plane magnetic field. FIGS. 9B and 9D show the angle-dependent difference in Hall resistances ($R_{DiffHall}(I,\alpha)$) at different bias currents for samples BS5 and TA, respectively. The $R_{DiffHall}(I,\alpha)$ for all of samples increased with bias current and had a maxima located at about 180°. In FIG. 9B, curve 82 is the angle-dependent difference in Hall resistances for the sample BS5 at +1.5 mA bias current, curve 84 is the angle-dependent difference in Hall resistances for the sample BS5 at +3.5 mA bias current, curve 86 is the angle-dependent difference in Hall resistances for the sample BS5 at +5.5 mA bias current, curve 88 is the angle-dependent difference in Hall resistances for the sample BS5 at +7.5 mA bias current, and curve 90 is the angle-dependent difference in Hall resistances for the sample BS5 at +8.5 mA bias current. In FIG. 9D, curve 102 is the angle-dependent difference in Hall resistances for the sample Ta at +1.5 mA bias current, curve 104 is the angle-dependent difference in Hall resistances for the sample Ta at +3.5 mA bias current, curve 106 is the angle-dependent difference in Hall resistances for the sample Ta at +5.5 mA bias current, curve 108 is the angle-dependent difference in Hall resistances for the sample Ta at +7.5 mA bias current, and curve 110 is the angle-dependent difference in Hall resistances for the sample Ta at +8.5 mA bias current. FIG. 11A is a plot of $R_{AHE}$ versus applied out-of-plane external magnetic field. As shown in FIG. 11A, all samples saturate at about ±1.6 T ($\pm\mu_0 M_S$, where $\mu_0$ is magnetic permeability of free space and $M_S$ is saturation magnetization of the CoFeB layer). The slope is the largest for the BS5 sample as the BS5 sample includes a $Bi_xSe_{(1-x)}$ layer with the largest resistivity, which allows the largest current flow through the CoFeB layer. The $$\frac{dR_{AHE}}{dH}$$

values after considering current shunting and short circuit effects were found to be −7.02, −7.56. −7.93, and −9.48 Ω/T for BS5, BS10, BS20, and Ta samples, respectively. After knowing the $$\frac{dR_{AHE}}{dH}$$

values, $H_{OOP}$ can be determined by curve fitting of the $Ra_{Diffhall}(I,\alpha)$ data using equation (1).

Figure 11B:
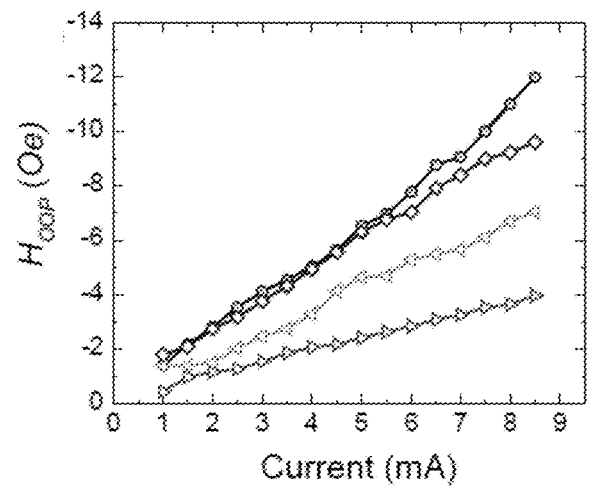
FIG. 11B shows the current-induced magnetic field $H_{OOP}$ change with respect to the bias current in samples BS5, BS10, BS20, and Ta.
Figure 11C:
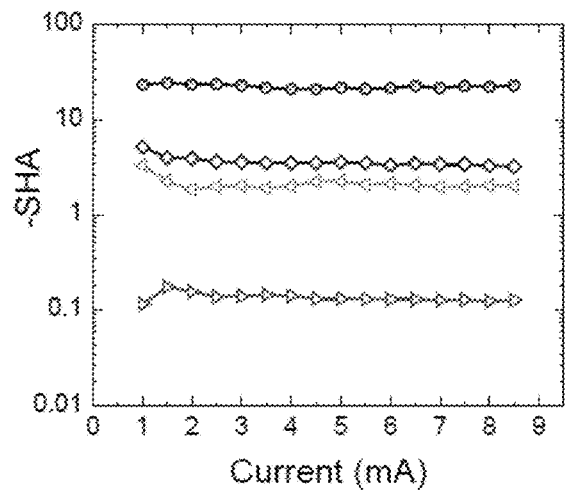
FIG. 11C shows a plot of the spin Hall angle (SHA) versus the total bias current for samples BS5, BS10, BS20, and Ta.

FIG. 11B shows the current-induced magnetic field $H_{OOP}$ change with respect to the bias current in samples BS5, BS10, BS20, and Ta. $H_{OOP}$ is linear with respect to the bias current due to the linearity of the spin-orbit field with the bias current ($H_{SO}=-\lambda_{SO}I(\hat{\sigma}\times\hat{m})$), where coefficient $\lambda_{SO}$ characterizes spin-orbit coupling of the material). The ratio of current-induced out-of-plane field per unit current density in $$Bi_xSe_{(1-x)}\left(\frac{H_{OOP}}{J_{SHM}}\right)$$

by using linear fit was found to be (−1.20±0.03), (−0.167±0.003), (−0.104±0.03) Oe $(10^{-4})/(A/cm^2)$, and (−0.62±0.01) Oe $(10^{-6})/(A/cm^2)$ for BS5, BS10, BS20, and Ta samples. The from the $Bi_xSe_{(1-x)}$ samples were as large as two orders of magnitude greater than that of the Ta sample. Also, the Ta sample has comparable $$H \frac{H_{OOP}}{J_{SHM}}$$

value to previously reported values for Ta and other heavy metals. FIG. 8C shows a plot of the spin Hall angle (SHA) versus the total bias current for samples BS5, BS10, BS20, and Ta; the spin Hall angle remains constant with the bias current as expected.

The ratio $$\frac{J_S}{J_{SHM}}$$

is commonly known as spin Hall angle (SHA or $\theta_{SHA}$) which determines the efficiency of the spin Hall material. $J_S$ is the spin current and $J_{SHM}$ is the charge current. At room temperature, the SHAs were found to be $-22.41\pm0.88$, $-3.47\pm0.26$, $-2.13\pm0.2$, and $-0.14\pm0.01$ for the samples BS5, BS10, BS20, and Ta, respectively (the uncertainty is average deviation of the SHA at the different bias current). The BS5 sample had the largest SHA value among any other spin Hall material reported so far at RT (Table 1), and the SHA of the Ta control sample is comparable to the previously reported values.

$$(1.03\pm0.09)\frac{\hbar}{2e}\Omega^{-1}m^{-1}$$

for the BS5, BS10, and BS20 samples, respectively and $$(0.77\pm0.05)\times 10^5 \frac{\hbar}{2e}\Omega^{-1}m^{-1}$$

for the Ta sample. The BS10 sample has the largest SHC among BS5, BS10, and BS20 due to the smaller resistivity compared to BS5. The SHC of BS5 is about 1.76 times larger than that of the Ta sample. A summary of the SHA and the SHC for the samples and previously reported spin Hall materials are presented in Table 1. The charge conductivity of BS5, BS10, and BS20 samples is lower in comparison to the heavy metals; however, sputtered $Bi_xSe_{(1-x)}$ films have comparable or larger SHC and larger $$H\frac{H_{OOP}}{J_{SHM}}$$

than heavy metals. This confirms that the large SOT originated from spin-orbit coupling.

In the measurement system used, only the external magnetic field angle with respect to the current flow direction was measured. To determine $R_{PHE}$, $\beta$ was expressed in terms of $\alpha$. From FIG. 10, the total x- and y-components of the magnetic field are $H_{Total,x}=H_{Total}\cos\beta=H_{ext}\cos\alpha$ and $H_{Total,y}=H_{Total}\sin\beta=H_{ext}\sin\alpha\pm H_T$; dividing the y-component of the total magnetic field by the x-component gives,

| Parameter | $Bi_xSe_{(1-x)}$ (this work) | $(bi_{0.5}Sb_{0.5})_2Te_3$ (ref. 13) | $Bi_2Se_3$ (Ref. 12) | β-Ta (control sample) | β-W (Ref. 8) | Pt (Ref. 9) |
|---|---|---|---|---|---|---|
| $\theta_{SHA} = \frac{J_s}{J_{SHM}}$ | 22.41 (RT) | 425 (at 1.9K) | 3.5 (RT) | 0.14 (RT) | 0.3 (RT) | 0.08 (RT) |
| $SHC\left(10^5 \frac{\hbar}{2e}\Omega^{-1}m^{-1}\right)$ | 1.36 | — | 2.0 | 0.77 | 1.8 | 3.4 |
| Switching Current density (A/cm²) | $2.7\times 10^5$ | $8.9\times 10^4$ | — | $1.11\times 10^7$ | $1.6\times 10^6$ | |

Figure 11D:
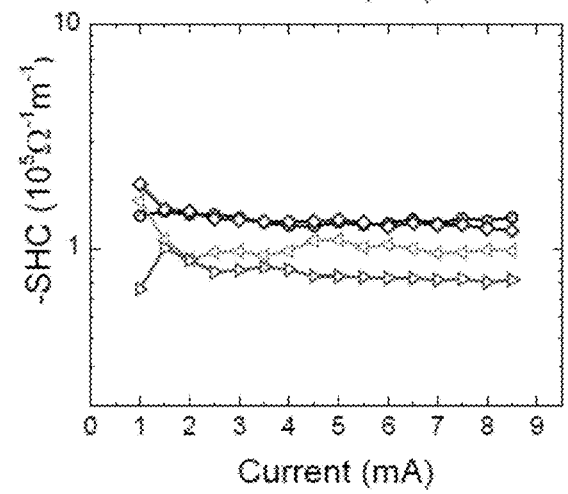
FIG. 11D demonstrates spin Hall conductivity versus the total bias current for different samples.

The resistivity of the $Bi_xSe_{(1-x)}$ films is highly thickness-dependent; as a result, the giant spin Hall angle is believed to be mainly due to the spin-orbit coupling from the bulk of the films and a possible small contribution from the surface as well. The spin Hall conductivity (SHC) is defined as $$\sigma_{SHC} = \theta_{SHA}\sigma\frac{\hbar}{2e},$$

where σ is charge conductivity of the spin Hall material. FIG. 11D demonstrates spin Hall conductivity versus the total bias current for different samples. The SHC were found to be (1.34±0.05), (1.36±0.10), $$\beta = \tan^{-1}\left(\frac{H_{ext}\sin\alpha \pm H_T}{H_{ext}\cos\alpha}\right).$$

The value of external field angle β can be substituted in equation (1) to obtain $$R_{DiffHall}(I,\alpha) = C1\sin\left(2\tan^{-1}\left(\frac{H_{ext}\sin\alpha + H_T}{H_{ext}\cos\alpha}\right)\right) - C1\sin\left(2\tan^{-1}\left(\frac{H_{ext}\sin\alpha - H_T}{H_{ext}\cos\alpha}\right)\right) + 2\frac{dR_{ANE}}{dH}H_{OOP}\cos\alpha + C$$

where C1 is the planar Hall coefficient and C is the resistance offset. $H_T$ can be determined by taking the difference of Hall resistances for positive and negative currents and curve fitting it with equation (2). FIGS. 11B and 11D show that, after using an in-plane magnetic field to make the film a single magnetic domain, the difference in Hall resistance had a cos α nature, which indicates that $H_T$ was not significant.

Figure 12A:
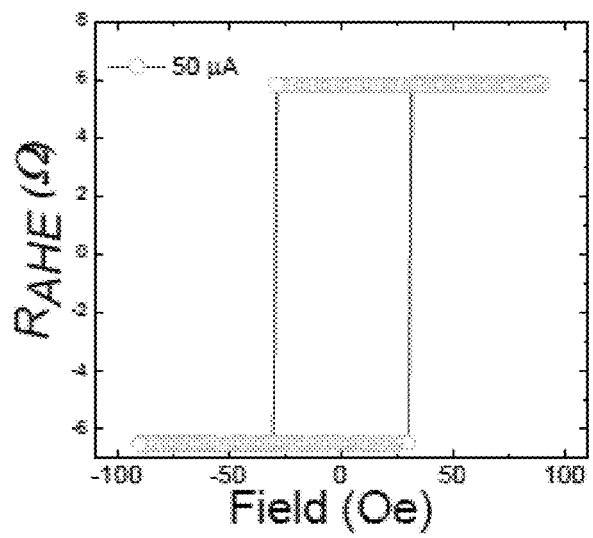

To investigate the strength of SOT from the $Bi_xSe_{(1-x)}$ films, switching of perpendicular magnetization was performed. For the switching experiment, a sample including a Si substrate/SiO$_2$ layer/MgO layer (about 2 nm)/$Bi_xSe_{(1-x)}$ layer (about 5 nm)/Ta layer (about 0.5 nm)/CoFeB layer (about 0.6 nm)/Gd layer (about 1.2 nm)/CoFeB layer (about 1.1 nm)/MgO layer (about 2 nm)/Ta layer (about 2 nm) sample and a control sample including a Si substrate/SiO$_2$ layer/Ta layer (about 5 nm)/CoFeB layer (about 0.6 nm)/Gd layer (about 1.2 nm)/CoFeB layer (about 1.1 nm)/MgO layer (about 2 nm)/Ta layer (about 2 nm) by using magnetron sputtering. The samples were patterned into Hall-bars with width 10 μm used for the measurement. FIGS. 12A and 12F are plots illustrating measurement of out-of-plane magnetization by measuring $R_{AHE}$. The non-zero $R_{AHE}$ at zero magnetic field confirms that the easy axis of the magnetization is along the out-of-plane direction for both samples.

Figure 12B:
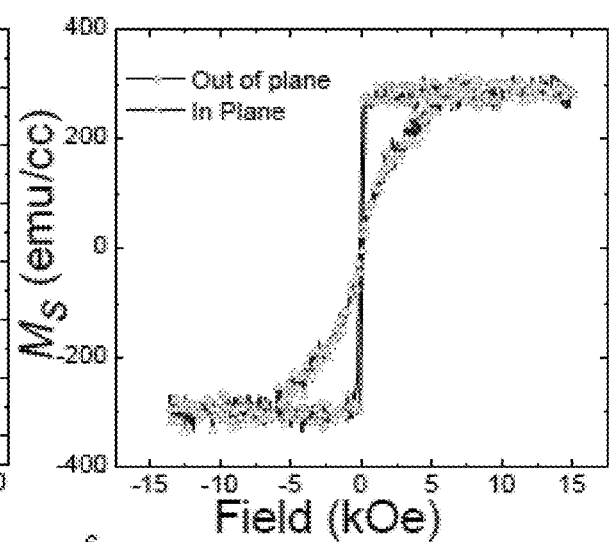
FIG. 12B is a plot showing an out-of-plane field sweep hysteresis loop for a sample.
Figure 12C:
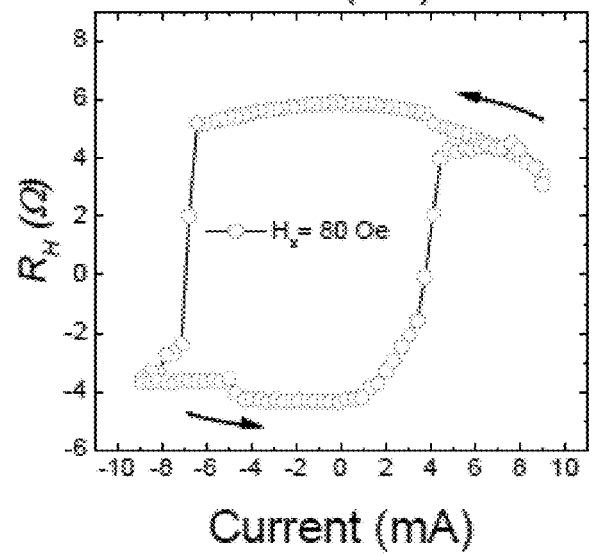
FIGS. 12C and 12D are plots showing the $R_H$ loops of $Bi_xSe_{(1-x)}$ under layer sample as a result of dc current sweep under the application of constant in-plane bias field along the current channel.
Figure 12D:
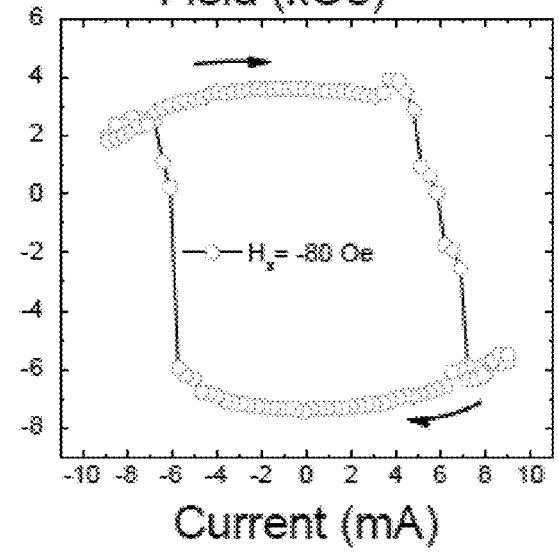

In addition to the Hall measurement, vibrating sample magnetometry (VSM) was also performed to characterize magnetic properties of our as deposited films using PPMS. FIG. 12B is a plot showing an out-of-plane field sweep hysteresis loop for a sample. The out-of-plane field sweep hysteresis loop as shown in FIG. 12B clearly shows the easy axis along the out-of-plane direction. The $M_s$ was found to be about 300 emu/cc, and anisotropy energy density was determined to be about $1.5 \times 10^6$ erg/cc. The perpendicular magnetic anisotropy (PMA) in the samples is due to the exchange interaction between the CoFeB and Gd layers. The same magnetic tri-layer CoFeB (0.6 nm)/Gd (1.2 nm)/CoFeB (1.1 nm) structure shows robust PMA after carrying out rapid thermal annealing (RTA) for 10 minutes at 300° C. followed by annealing at 300° C. for half an hour under the application of 5000 Oe in-plane magnetic field. FIGS. 12C and 9D are plots showing the $R_H$ loops of $Bi_xSe_{(1-x)}$ under layer sample as a result of dc current sweep under the application of constant in-plane bias field along the current channel. In the presence of a negative 80 Oe bias field (FIG. 12D), the current sweep from positive dc current to negative current favors magnetization in the downward direction ($M_s<0$), and switching of the magnetization occurs at about −7 mA current. The subsequent reverse current sweep from negative to positive current favors magnetization in the upward direction ($M_s>0$) and switching of the magnetization occurs at about 7 mA. FIG. 12C shows that the change in bias field direction changes the magnetization direction. The steps in switching confirm that the switching was due to domain wall nucleation and domain wall motion. FIG. 12E is a schematic drawing of a switching stack structure.

FIGS. 12G and 12H are plots showing $R_H$ loops of the Ta underlayer sample due to dc current sweep in presence of constant bias field along the current channel. The loops show that the orientation of magnetization direction is same as that of the $Bi_xSe_{(1-x)}$ sample under same bias field directions; however, the switching current is larger. The asymmetry in the threshold switching current is due to the failure of the tri-layer behaving as a single magnetic layer. The lower switching current in $Bi_xSe_{(1-x)}$ underlayer sample compared to the control sample confirms that the switching is mainly due to SOT from the 5 nm thick $Bi_xSe_{(1-x)}$ layer.

In order to characterize the SOT from the $Bi_xSe_{(1-x)}$ films, thin film stacks with a structure of Si/SiO$_2$/MgO (about 2 nm)/$Bi_xSe_{(1-x)}$ (varying nm)/CoFeB (about 5 nm)/MgO (about 2 nm)/Ta (about 5 nm) were deposited, with the thickness of the $Bi_xSe_{(i-x)}$ layer being one of 4 nm, 8 nm, 16 nm, or 40 nm. A control sample was also prepared with a 5 nm thick Ta layer replacing the $Bi_xSe_{(1-x)}$ layer. Unless otherwise stated, the labelling BS4, BS8, BS16, BS40 and Ta will be used for the samples with the thickness of the $Bi_xSe_{(1-x)}$ layer=4, 8, 16, 40 nm, and the control sample, respectively. The saturation magnetization of the CoFeB film was $1.24 \times 10^3$ emu/cc.

EDX and RBS were used for compositional analysis of $Bi_xSe_{(1-x)}$ films. FIGS. 14A and 14B are EDX composite maps for samples BS4 and BS8, respectively. FIGS. 14C and 14D are EDX line scans for Bi—Se composition for BS4 and BS8 samples, respectively. The composition of the films were found to be about 47:53 Bi:Se ratio with 3% uncertainty by using RBS. The EDX line scan shows that the ratio of Bi:Se has the same trend in both BS4 and BS8 samples. The upper interface of each $Bi_xSe_{(1-x)}$ film has stoichiometric $Bi_2Se_3$; however, the scan line moves vertically down in the film, the Bi concentration increases, then peaks, and then Bi concentration decreases near the lower surface (FIGS. 14C and 14D).

FIGS. 13A-13H show the high-angle annular dark-field scanning transmission electron microscopy (HAADF-STEM) images of samples BS4 and BS8, respectively. The HAADF-STEM images show that $Bi_xSe_{(1-x)}$ has a polycrystalline structure and that the atomic layers of Bi and Se are continuous in both BS4 and BS8 samples. In addition, the average grain orientation in the BS4 sample is about 2°±9° (from vertical c-orientation), which is almost same as the average grain orientation in the BS8 sample)(2°±8°. However, the average size of grains in the BS4 sample is approximately 7 nm wide and 4 nm high, whereas the average size of grains in the BS8 sample is approximately 18 nm wide and 8 nm high. The HAADF-STEM images also show that the CoFeB layer has no lattice fringes, confirming that it is amorphous in both the samples.

To determine SOT from $Bi_xSe_{(1-x)}$/CoFeB (5 nm)/MgO system dc planar Hall method was used. The in-plane SOT exerted by the accumulated spin current on the interface of the $Bi_xSe_{(1-x)}$/CoFeB (5 nm) was obtained by using Slonczewski's equation:

$$\tau_{\parallel} = \frac{\hbar J_s}{2eM_s t}(\hat{m} \times (\hat{\sigma} \times \hat{m}))$$

where h is the reduced Planck's constant, $J_S$ is the spin polarized current density, e is an electronic charge, $M_s$ is the saturation magnetization, t is the thickness of the ferromagnetic layer, m is the magnetization unit vector, and σ is the spin polarized current accumulation unit vector. The associated out-of-plane magnetic field with the in-plane torque ($\tau_{\parallel}$) is given by:

$$H_{OOP} = \frac{\hbar J_s}{2eM_s t}(\hat{\sigma} \times \hat{m})$$

Furthermore, the out-of-plane component of SOT is given by $$\tau_{195} = \alpha_T(\hat{m} \times \hat{\sigma})$$

where $\alpha_T$ is a coefficient which determines the efficiency of current induced effects. The associated in-plane magnetic field with the out-of-plane torque ($\tau_\perp$) is given by $$H_T = \alpha_T \hat{\sigma}$$

The ratio of current-induced out-of-plane field per unit current density in $$Bi_xSe_{(1-x)}\left(\frac{H_{OOP}}{J_{SHM}}\right)$$

by using linear fit was found to be (98.83±0.7), (23.96±0.19), (15.32±0.16), (9.32±0.11), and (2.39±0.05) Oe per $10^6$ A/cm$^2$, respectively for BS4-BS40. The $$\frac{H_{OOP}}{J_{SHM}}$$

from the $Bi_xSe_{(1-x)}$ samples were as large as two orders of magnitude greater than that of the Ta control.

The ratio $$\frac{J_S}{J_{SHM}}$$

is commonly known as spin Hall angle (SHA or $\theta_{SHA}$) which determines the efficiency of the spin Hall material. $J_S$ is the spin current and $J_{SHM}$ is the charge current. At room temperature, SHAs for samples BS4-BS40 are determined to be 18.62±0.13, 4.50±0.03, 2.88±0.03, 1.75±0.02, 0.45±0.01, respectively uncertainty is average deviation of the SHA at the different bias current). The BS4 sample had the largest SHA value among any other spin Hall material reported so far at RT (Table 2).

$$\beta = \tan^{-1}\left(\frac{H_{ext}\sin\alpha \pm H_T}{H_{ext}\cos\alpha}\right).$$

The value of external field angle β can be substituted in equation (1) to obtain $$R_{DH}(I,\alpha) = C1\sin\left(2\tan^{-1}\left(\frac{H_{ext}\sin\alpha + H_T}{H_{ext}\cos\alpha}\right)\right) - C1\sin\left(2\tan^{-1}\left(\frac{H_{ext}\sin\alpha - H_T}{H_{ext}\cos\alpha}\right)\right) + 2\frac{dR_{ANE}}{dH}H_{OOP}\cos\alpha + C$$

where C1 is the planar Hall coefficient and C is the resistance offset. $H_T$ can be determined by taking the difference of Hall resistances for positive and negative currents and curve fitting it with equation (2)

Figures 15A, 15B:
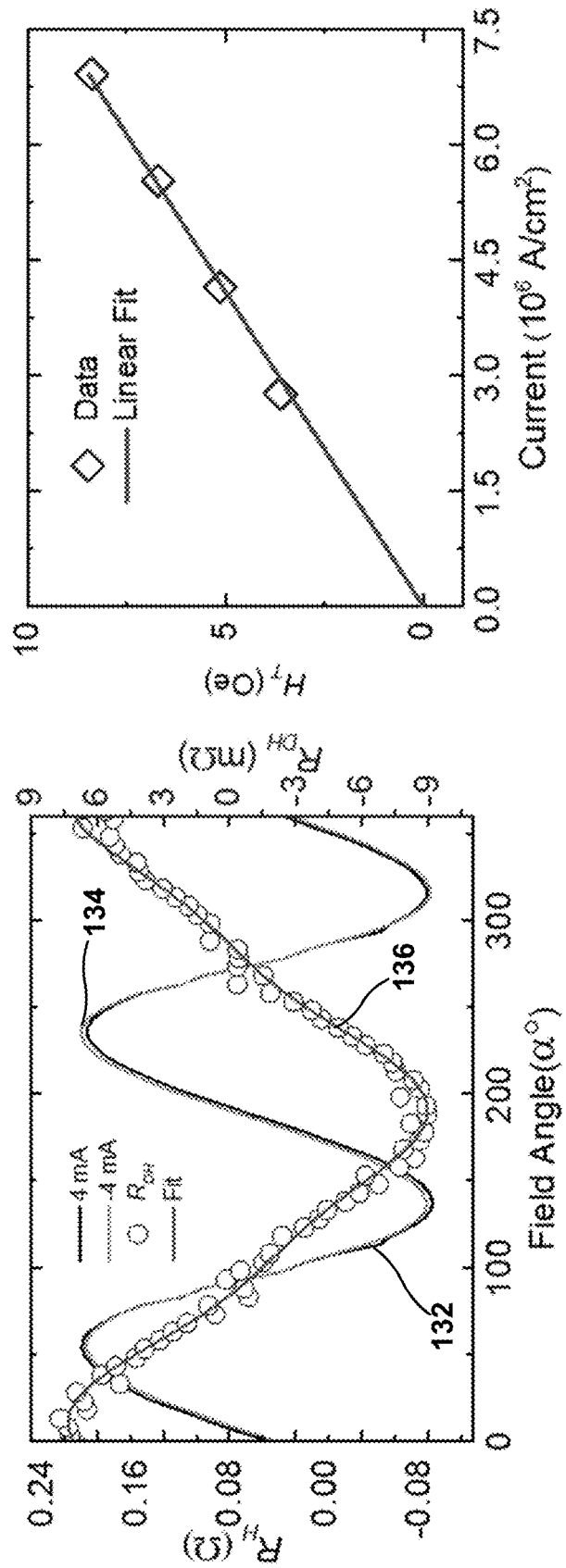
FIGS. 15A and 15B show the angle-dependent Hall resistance and difference in Hall resistance, and the field-like torque versus current density, respectively, for sample BS4.

FIGS. 15A and 15B show the characterization of H using smaller in-plane magnetic field. At a smaller in-plane field of approximately 200 Oe, which is sufficient to saturate the magnetization along the in-plane direction, $H_T$ was estimated to be (12.24±0.14) Oe per $10^6$ A/cm$^2$ in sample BS4 (FIG. 15B, where curve 132 was measured at −4 mA, curve 134 was measured at +4 mA, and curve 136 is a best fit curve). The $H_T$ for samples BS8 and BS16 was determined to be (8.11±0.06) and (4.16±0.06) Oe per $10^6$ A/cm$^2$ at a 200 Oe in-plane field, respectively. This large $H_T$ cannot be explained by Oersted field because the Oersted field contribution per $10^6$ A/cm$^2$ is only 0.5 Oe. Experimentally, as the thickness of the $Bi_xSe_{(1-x)}$ film increased, the grain size also increased, and the magnitude of the in-plane and out-of-

TABLE 2

| Parameters | $Bi_xSe_{(1-x)}$ (This work) | $Bi_2Se_3$ (Han et al., PRL (2017) | $Bi_2Se_3$ (Wang et al., Nature Communications (2017)) | β-Ta (Liu et al. Science (2012)) | Pt (Liu et al. PRL 2012)) |
|---|---|---|---|---|---|
| σ (Ω$^{-1}$m$^{-1}$) | 0.78 × 10$^4$ | 9.43 × 10$^4$ | 2.43 × 10$^4$ | 5.3 × 10$^5$ | 4.2 × 10$^6$ |
| $\sigma_{SH}$ $\left(10^5 \frac{\hbar}{2e}\Omega^{-1}m^{-1}\right)$ | 1.5 | 0.15 | 0.43 | −0.8 | 3.4 |
| $\theta_{SH}$ | 18.62 | 0.16 | 1.75 | −0.15 | 0.08 |
| $J_{sw}$ (A/cm$^2$) | 4.3 × 10$^5$ | 3 × 10$^6$ | 6 × 10$^5$ | 5.5 × 10$^6$ | 2.85 × 10$^7$-10$^8$ |
| Power dissipation (watt/m$^3$) | 2.37 × 10$^{15}$ | 9.54 × 10$^{15}$ | 1.48 × 10$^{15}$ | 5.7 × 10$^{15}$ | 1.93 × 10$^{16}$ |
| Symmetry breaking external in-plane magnetic field (Oe) | 80 | 1000 | 0 | 100 | 100 |
| Switched magnetic system | CoFeB/Gd/ CoFeB Out-of-plane | CoTb Out-of-plane | NiFe In-plane | CoFeB Out-of-plane | Co Out-of-plane |

A summary of the SHA and the SHC for the samples and previously reported spin Hall materials are presented in Table 2.

In the measurement system used, only the external magnetic field angle with respect to the current flow direction was measured. To determine $R_{PHE}$, β was expressed in terms of α. The total x- and y-components of the magnetic field are $H_{Total,x}$−$H_{Total}\cos\beta$=$H_{ext}\cos\alpha$ and $H_{Total,y}$−$H_{Total}\sin\beta$=$H_{ext}\sin\alpha\pm H_T$, dividing the y-component of the total magnetic field by the x-component gives, plane torques decreased. This gives a clear indication of the influence of grain size on the SOT in sputtered $Bi_xSe_{(1-x)}$ films.

In addition to the dc planar Hall measurement, spin torque ferromagnetic resonance (ST-FMR) measurements were performed on samples Si/SiO$_2$/MgO (2 nm)/$Bi_xSe_{(1-x)}$ (4 nm and 16 nm)/CoFeB (5 nm)/MgO (2 nm)/Ta (1 nm) to validate the giant charge-to-spin conversion from the sputtered $Bi_xSe_{(1-x)}$ films. The SHA values obtained by performing the ST-FMR measurement for the $Bi_xSe_{(1-x)}$ BS4 and BS16 samples were 8.67±1.08 and 1.56±0.01, respectively. The SHA values obtained from the ST-FMR measurement are similar to those determined by using the dc planar Hall measurement. Given the fact that the previous reports of the SHA values of topological insulators differ from report to report, we emphasize that our SHA values determined by the dc planar Hall and ST-FMR methods match closely. FIGS. 16A-16D illustrate the ST-FMR results. FIG. 16A is a schematic diagram showing a stack structure and co-ordinate system for a magnetic stack including sample BS4. FIG. 16B is a plot of the ST-FMR of sample BS4. FIG. 16C is a plot of spin Hall angle (SHA) variation with excitation frequency of sample BS4. FIG. 16D is a plot of frequency versus resonance field for sample BS4.

To investigate the strength of SOT from the $Bi_xSe_{(1-x)}$ films, switching of perpendicular magnetization was performed. For the switching experiment, a sample including a Si substrate/$SiO_2$ layer/MgO layer (about 2 nm)/$Bi_xSe_{(1-x)}$ layer (4 nm)/Ta layer (about 0.5 nm)/CoFeB layer (about 0.6 nm)/Gd layer (about 1.2 nm)/CoFeB layer (about 1.1 nm)/MgO layer (about 2 nm)/Ta layer (about 2 nm) sample and a control sample including a Si substrate/$SiO_2$ layer/Ta layer (about 5 nm)/CoFeB layer (about 0.6 nm)/Gd layer (about 1.2 nm)/CoFeB layer (about 1.1 nm)/MgO layer (about 2 nm)/Ta layer (about 2 nm) by using magnetron sputtering. The samples were patterned into Hall-bars with width 15 μm used for the measurement. FIGS. 17B and 27B are plots illustrating measurement of out-of-plane magnetization by measuring $R_{AHE}$. The non-zero $R_{AHE}$ at zero magnetic field confirms that the easy axis of the magnetization is along the out-of-plane direction for both samples.

FIGS. 17C and 17D are plots showing the $R_H$ loops of $Bi_xSe_{(1-x)}$ under layer sample as a result of dc current sweep under the application of constant in-plane bias field along the current channel. In the presence of a negative 80 Oe bias field (FIG. 17D), the current sweep from positive dc current to negative current favors magnetization in the downward direction ($M_z<0$), and switching of the magnetization occurs at about −7.2 mA current. The subsequent reverse current sweep from negative to positive current favors magnetization in the upward direction ($M_z>0$) and switching of the magnetization occurs at about 7.2 mA. FIG. 17C shows that the change in bias field direction changes the magnetization direction. The steps in switching confirm that the switching was due to domain wall nucleation and domain wall motion.

FIGS. 18C and 18D are plots showing $R_H$ loops of the Ta underlayer sample due to dc current sweep in presence of constant bias field along the current channel. The loops show that the orientation of magnetization direction is same as that of the $Bi_xSe_{(1-x)}$ sample under same bias field directions; however, the switching current is larger. The asymmetry in the threshold switching current is due to the failure of the tri-layer behaving as a single magnetic layer. The lower switching current in $Bi_xSe_{(1-x)}$ underlayer sample compared to the control sample confirms that the switching is mainly due to SOT from the 4 nm thick $Bi_xSe_{(1-x)}$ layer.

Figure 19A:
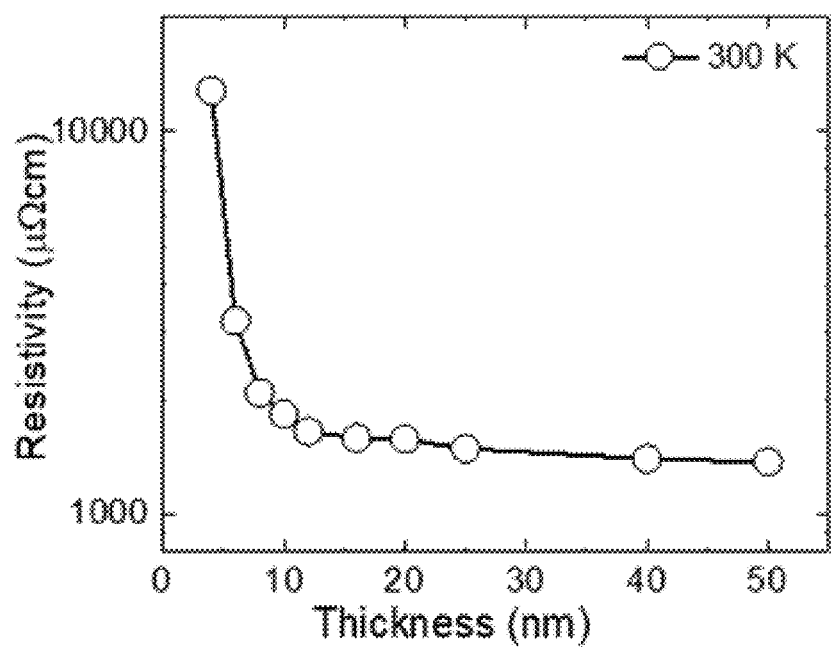
FIG. 19A is a plot of resistivity as a function of thickness for $Bi_xSe_{(1-x)}$ as a function of film thickness.
Figure 19B:
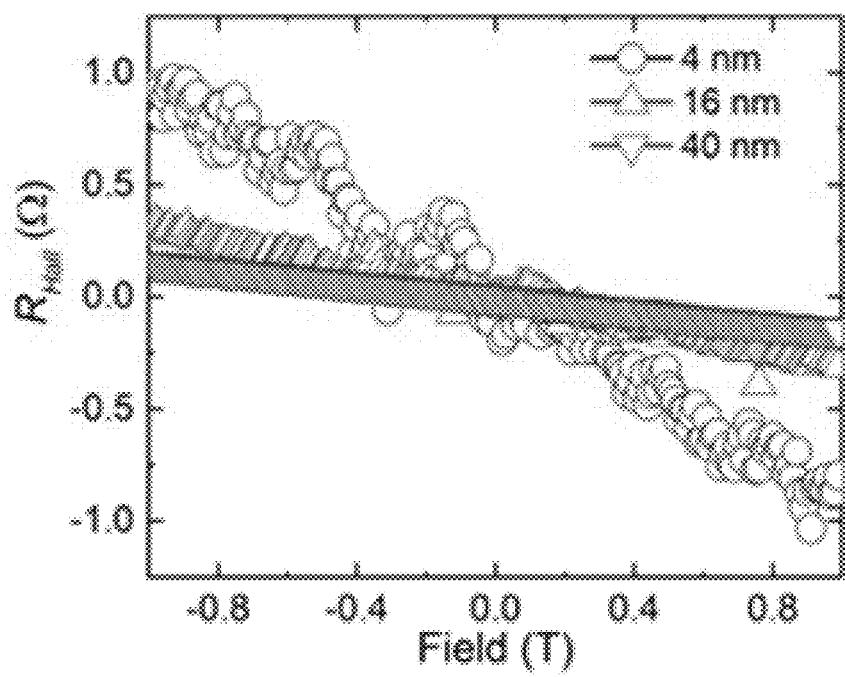
FIG. 19B is a plot of Hall resistance as a function of applied field for $Bi_xSe_{(1-x)}$ films of different thickness for the characterization of carrier concentration.

As shown in FIG. 19A, the 3D carrier concentrations for 4, 16, and 60 nm $Bi_xSe_{(1-x)}$ films was approximately 1.6, 1.2, and $1.0 \times 10^{21}/cm^3$, respectively, by using Hall measurements. FIG. 19B is a plot of Hall resistance versus applied magnetic field for 4, 16, and 60 nm $Bi_xSe_{(1-x)}$ films. The negative slope of the Hall resistance indicates that the majority of the carriers in the films were electrons.

A large SHA and low switching current density may facilitate realization of SOT-based spintronics devices. Moreover, growth and development of smooth spin Hall material interface should be achievable with a low thermal budget. For example, growth of graphene by using chemical vapor deposition (CVD) method has tremendously changed its large scale production. To ease integration of spintronic devices in CMOS, the SOT generator should be able to be grown on silicon substrate. The proposed sputtered $Bi_xSe_{(1-x)}$ films in this article have large SHA and small switching current density compared to other SOT generators reported at room temperature. In addition, sputtered $Bi_xSe_{(1-x)}$ films also have comparable or better SHC compared to other reported materials (see Table 1). Furthermore, the $Bi_xSe_{(1-x)}$ may be grown on silicon substrate having films (both $Bi_xSe_{(1-x)}$ only and full stacks) with relatively smooth surfaces in comparison to MBE-grown topographical insulator films. The current flow in to the $Bi_xSe_{(1-x)}$ film as a SOT generator is typically on the order of few tens of microAmperes, which lowers the risk of potential breakdown of the devices due to joule heating. However, the SOT is linear with respect to the bias current.

In some examples, rather than utilizing a single $Bi_xSe_{(1-x)}$ layer as a SOT generator, $Bi_xSe_{(1-x)}$ layers may be alternated with thin heavy metal films including any of the heavy metals described herein. This may reduce the total resistance of the SOT generator.

Although the description primarily describes $Bi_xSe_{(1-x)}$ layers in MTJ devices, $Bi_xSe_{(1-x)}$ layers may be utilized in other devices. For example, $Bi_xSe_{(1-x)}$ materials may be used in domain wall based memory and logic devices where SOT from $Bi_xSe_{(1-x)}$ may assist domain wall motion. Due to the resistivity of the $Bi_xSe_{(1-x)}$ material, almost all of the current may flow through the ferromagnetic layer or magnetic domain, which can move domain walls due to STT alone. Due to the large resistivity, the current in the $Bi_xSe_{(1-x)}$ layer may flow on the order of micro-amps, which may be sufficient to produce large SOT. A combination of STT and SOT may move domain walls faster than previously observed by using the $Bi_xSe_{(1-x)}$ films as a SOT generator.

Further, while the above description primarily describes $Bi_xSe_{(1-x)}$ as a SOT generator, other materials may perform similarly. For example, $Bi_xTe_{(1-x)}$, or $Sb_xTe_{(1-x)}$, or mixtures including at least two of $Bi_xSe_{(1-x)}$, $Bi_xTe_{(1-x)}$, or $Sb_xTe_{(1-x)}$ may be used as a SOT generator. Additionally, in some examples a SOT generating material may include a dopant. The dopant may include at least one of In, Sn, Bi, Se, Te, Au, Ag, Cu, Ti, V, Fe, Mn, Cr, Co, Ni, Gd, Tb, Sm, Nd, Eu, Dy, or Ho. The dopant may be different than the materials already in the SOT generating material.

Various examples have been described. These and other examples are within the scope of the following claims.

What is claimed is:

1. A material comprising:
    $Bi_xSe_{(1-x)}$, wherein x is greater than 0, less than 1, and not 0.4, wherein the material comprises a concentration gradient of Bi, and wherein the material exhibits a Spin Hall Angle of greater than about 3.5 at room temperature.

2. The material of claim 1, wherein the material exhibits a Spin Hall Angle of greater than about 20 at room temperature.

3. The material of claim 1, wherein x is between about 0.45 and about 0.5.

4. The material of claim 1, wherein x is about 0.47.

5. The material of claim 1, further comprising a first region comprising a first composition comprising $Bi_{x1}Se_{(1-x1)}$, a second region comprising a second composition comprising $Bi_{x2}Se_{(1-x2)}$, and a third region comprising a third composition comprising $Bi_{x3}Se_{(1-x3)}$, wherein the second region is between the first region and the third region, and wherein x2 is greater than x1 and greater than x3.

6. A device comprising:
a spin-orbit torque generating layer comprising at least one of $Bi_xSe_{(1-x)}$, $Bi_xTe_{(1-x)}$, or $Sb_xTe_{(1-x)}$, wherein x is greater than 0 and less than 1; and
a magnetic tunnel junction structure adjacent to the spin-orbit torque generating layer.

7. The device of claim 6, wherein the spin-orbit torque generating layer exhibits a Spin Hall Angle of greater than about 3.5 at room temperature.

8. The device of claim 6, wherein the at least one of $Bi_xSe_{(1-x)}$, $Bi_xTe_{(1-x)}$, or $Sb_xTe_{(1-x)}$ comprises $Bi_xSe_{(1-x)}$, and wherein x is not 0.4.

9. The device of claim 6, wherein the spin-orbit torque generating layer exhibits a Spin Hall Angle of greater than about 15 at room temperature.

10. The device of claim 6, wherein x is greater than 0.4.

11. The device of claim 6, wherein x is between about 0.45 and about 0.5.

12. The device of claim 6, wherein the spin-orbit torque generating layer includes a concentration gradient of Bi or Sb.

13. The device of claim 6, wherein the spin-orbit torque generating layer comprises a first region comprising at least one of $Bi_{x1}Se_{(1-x1)}$, $Bi_{x1}Te_{(1-x1)}$, or $Sb_{x1}Te_{(1-x1)}$, a second region comprising at least one of $Bi_{x2}Se_{(1-x2)}$, $Bi_{x2}Te_{(1-x2)}$, or $Sb_{x2}Te_{(1-x2)}$, and a third region comprising at least one of $Bi_{x3}Se_{(1-x3)}$, $Bi_{x3}Te_{(1-x3)}$, or $Sb_{x3}Te_{(1-x3)}$, wherein the second region is between the first region and the third region, and wherein x2 is greater than x1 and greater than x3.

14. The device claim 6, further comprising a dopant not already present in the spin orbit torque generating layer, wherein the dopant comprises at least one of In, Sn, Bi, Se, Te, Au, Ag, Cu, Ti, V, Fe, Mn, Cr, Co, Ni, Gd, Tb, Sm, Nd, Eu, Dy, or Ho.

15. The device of claim 6, wherein the magnetic tunnel junction structure comprises a free layer, a fixed layer, and an oxide layer between the free layer and the fixed layer, and wherein the spin-orbit torque generating layer is adjacent to the free layer.

16. The device of claim 15, further comprising a substrate, wherein the spin-orbit torque generating layer is between the free layer and the substrate.

17. The device of claim 15, further comprising a substrate, wherein the free layer is between the spin-orbit torque generating layer and the substrate.

18. The device of claim 17, wherein the spin-orbit torque generating layer is on the free layer.

19. The device of claim 15, further comprising a silicon substrate.

20. The device of claim 15, wherein the spin-orbit torque generating layer comprises at least one of $Bi_xSe_{(1-x)}$, $Bi_xTe_{(1-x)}$, and wherein the concentration of Bi is less in a portion of the spin-orbit torque generating layer nearer to the free layer.

21. The device of claim 6, wherein an average grain size of the spin-orbit torque generating layer is between about 5 nanometers and about 15 nanometers.

22. The device of claim 6, wherein a crystalline axis of the spin-orbit torque generating layer is canted at a non-perpendicular angle to a major surface of the spin-orbit torque generating layer.

23. The device of claim 6, wherein the spin-orbit torque generating layer defines a thickness between about 4 nm and about 40 nm.

24. The device of claim 23, wherein the spin-orbit torque generating layer defines an average surface roughness of less than or equal to about 0.6 nm.

25. The device of claim 6, wherein the spin-orbit torque generating layer defines an average surface roughness of less than about 5% of a thickness of the spin-orbit torque generating layer.

26. A material comprising:
a spin-orbit torque generating layer comprising a Spin Hall effect material having an average grain size of between about 3 nanometers and about 15 nanometers.

27. The material of claim 26, wherein the Spin Hall effect material comprises at least one of $Bi_xSe_{(1-x)}$, $Bi_xTe_{(1-x)}$, or $Sb_xTe_{(1-x)}$, wherein x is greater than 0 and less than 1.

28. The material of claim 27, wherein the Spin Hall effect material comprises $Bi_xSe_{(1-x)}$, wherein x is greater than 0, less than 1, and not 0.4.

29. A method comprising:
depositing at least one of $Bi_xSe_{(1-x)}$, $Bi_xTe_{(1-x)}$, or $Sb_xTe_{(1-x)}$ on a substrate using at least one of sputtering, atomic layer deposition, chemical vapor deposition, or electrochemical deposition to form a spin-orbit torque generating layer, wherein x is greater than 0 and less than 1; and
forming a magnetic tunnel junction structure adjacent to the spin-orbit torque generating layer.

30. The method of claim 29, further comprising:
depositing the at least one of $Bi_xSe_{(1-x)}$, $Bi_xTe_{(1-x)}$, or $Sb_xTe_{(1-x)}$ on a substrate using magnetron sputtering.

31. The method of claim 30, wherein the substrate comprises a semiconductor.

32. The method of claim 31, wherein the substrate comprises Si or an Si alloy.

33. The method of claim 32, wherein the substrate further comprises at least one of a silicon oxide layer or an MgO layer on the Si or Si alloy.

34. The method of claim 29, wherein a target material comprises a mixture or alloy of Bi and Se.

* * * * *